United States Patent
Ohta

(10) Patent No.: US 11,063,666 B2
(45) Date of Patent: Jul. 13, 2021

(54) COMMUNICATION DEVICE, COMMUNICATION METHOD, AND COMMUNICATION PROGRAM

(71) Applicant: Sony Corporation, Tokyo (JP)

(72) Inventor: Shinji Ohta, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/801,155

(22) Filed: Feb. 26, 2020

(65) Prior Publication Data
US 2021/0050917 A1    Feb. 18, 2021

(30) Foreign Application Priority Data

Aug. 16, 2019 (JP) .............................. JP2019-149513

(51) Int. Cl.
*H04B 10/118* (2013.01)
*H03M 13/29* (2006.01)
*H04L 1/00* (2006.01)
*H04L 7/00* (2006.01)

(52) U.S. Cl.
CPC ...... *H04B 10/118* (2013.01); *H03M 13/2909* (2013.01); *H03M 13/2936* (2013.01); *H04L 1/0071* (2013.01); *H04L 7/0066* (2013.01)

(58) Field of Classification Search
CPC .............................. H04B 10/112; H04B 10/118
See application file for complete search history.

(56) References Cited

U.S. PATENT DOCUMENTS

| 6,067,646 A * | 5/2000 | Starr ..................... H04L 1/0001 714/701 |
| 8,495,476 B2 | 7/2013 | Abu-Surra et al. |
| 2016/0065306 A1* | 3/2016 | Huang ................... H04W 4/46 398/118 |
| 2017/0026121 A1 | 1/2017 | Everett et al. |
| 2019/0379457 A1* | 12/2019 | Mougin ................. H04B 10/40 |

FOREIGN PATENT DOCUMENTS

| CN | 109687908 A | 4/2019 |
| JP | 11-098086 A | 4/1999 |
| KR | 2018-0026979 A | 3/2018 |

OTHER PUBLICATIONS

Bidan et al., Reed-Solomon Turbo Product Codes for Optical Communications: From Code Optimization to Decoder Design, EURASIP Journal on Wireless Communications and Networking, vol. 2008, Hindawi, 2008 (Year: 2008).*
Extended European search report dated Oct. 12, 2020, in corresponding European patent Application No. 20158035.4, 9 pages.

* cited by examiner

*Primary Examiner* — Shi K Li
(74) *Attorney, Agent, or Firm* — Xsensus LLP

(57) ABSTRACT

A communication device includes an interleaving unit that determines an interleaving length of transmit data to be transmitted through free-space optical communication, and interleaves the transmit data based on the determined interleaving length, and a shaping unit that shapes the interleaved transmit data so as to make the interleaving length detectable on a receiving side of the free-space optical communication.

20 Claims, 13 Drawing Sheets

COMMUNICATION DEVICE, COMMUNICATION METHOD, AND COMMUNICATION PROGRAM

CROSS-REFERENCE TO RELATED APPLICATIONS

The present application claims priority to and incorporates by reference the entire contents of Japanese Patent Application No. 2019-149513 filed in Japan on Aug. 16, 2019.

BACKGROUND

1. Field

The present disclosure relates to a communication device, a communication method, and a communication program.

2. Description of the Related Art

Wireless communication using a radio wave as a transmission medium is conventionally well known. However, in recent years, free-space optical communication (also called "optical wireless communication") using light as a transmission medium has also begun to attract attention. Conventional techniques are described, for example, in Japanese Laid-open Patent Publication No. H11-98086.

Communication using an optical fiber as a transmission path is well known as the optical communication. Techniques used in the optical fiber are supposed to be also applicable to the free-space optical communication. However, since the optical fiber greatly differs from the free-space optical communication in transmission path characteristics, simply applying the techniques used in the optical fiber to the free-space optical communication does not necessarily achieve high communication performance (such as high quality and low delay).

Therefore, the present disclosure proposes a communication device, a communication method, and a communication program capable of achieving the free-space optical communication at a high performance level.

SUMMARY

It is an object of the present disclosure to at least partially solve the problems in the conventional technology.

To solve the above problem, a communication device includes: an interleaving unit configured to determine an interleaving length of transmit data to be transmitted through free-space optical communication, and interleave the transmit data based on the determined interleaving length; and a shaping unit configured to shape the interleaved transmit data so as to make the interleaving length detectable on a receiving side of the free-space optical communication.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
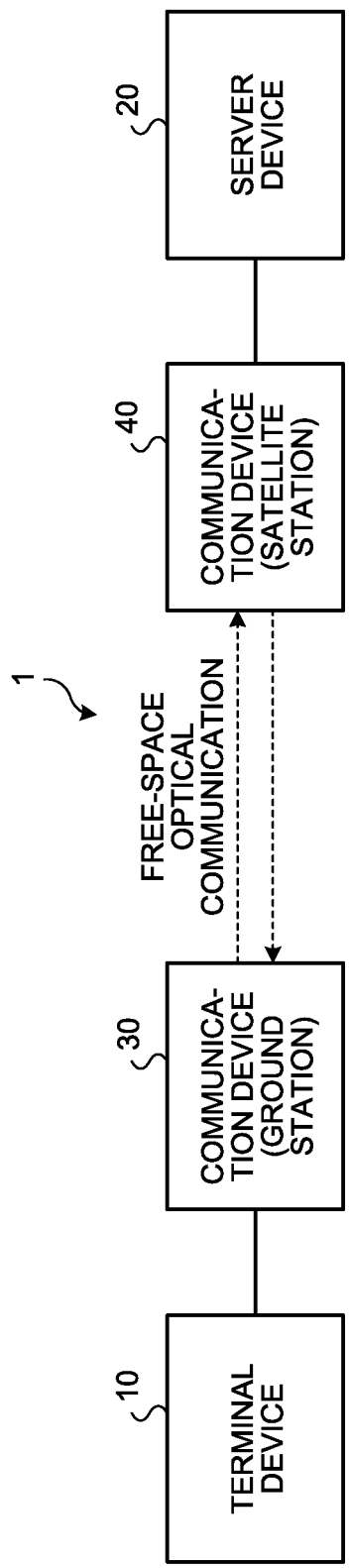
FIG. 1 is a diagram illustrating a configuration example of a communication system according to an embodiment of the present disclosure.

The following describes an embodiment of the present disclosure in detail based on the drawings. In the following embodiment, the same parts are denoted by the same reference numerals, and thus, description thereof will not be repeated.

The present disclosure will be described according to the order of items listed below.
1. Introduction
2. Configuration of Communication System
2-1. Overall Configuration of Communication System
2-2. Specific Configuration Example of Communication System
2-3. Configuration of Terminal Device
2-4. Configuration of Server Device
2-5. Configuration of Communication Device (Ground Station)
2-6. Configuration of Communication Device (Satellite Station)
2-7. Relation in Physical Layer Configuration between OSI Reference Model and Communication Device
3. Error Correction Block Format
3-1. Basic Configuration
3-2. Extended Configuration
4. Operations of Communication System
4-1. Basic Operation
4-2. Transmit Data Processing
4-3. Received Data Processing
5. Modifications
5-1. Modifications in terms of Processing
5-2. Modifications in terms of Device Configuration
5-3. Other Modifications
6. Conclusion

1. INTRODUCTION

In recent years, free-space optical communication (also called "optical wireless communication") using light as a transmission medium has begun to attract attention. Communication using an optical fiber as a transmission path is well known as the optical communication, and techniques used in the optical fiber are supposed to be also applicable to the free-space optical communication. However, since the optical fiber greatly differs from the free-space optical communication in transmission path characteristics, simply applying the techniques used in the optical fiber to the free-space optical communication does not necessarily achieve high communication performance (such as high quality and low delay).

For example, in an optical communication system using the optical fiber as the transmission path, a data error rate increases with increase in speed. Therefore, the optical communication system using the optical fiber as the transmission path introduces forward error correction (FEC) to ensure sufficient communication quality. This error correction mechanism is supposed to be also applicable to the free-space optical communication. However, the error correction method used in the optical communication system using the optical fiber as the transmission path is an error correction method based on an assumption that the data error distribution is that of random errors caused by deterioration in signal-to-noise ratio (S/N ratio) of received signals. Therefore, many cases are supposed to occur where the correction cannot correct burst errors caused by atmospheric disturbances that are likely to occur in the free-space optical communication.

In the case of optimizing a communication method according to the transmission path characteristics of the free-space optical communication, a concern is also present that communication methods lack compatibility with one another, and the development cost and the introduction risk of a communication system increase as a whole.

Therefore, the present embodiment takes the following measures to solve this problem.

A communication system of the present embodiment is a free-space optical communication system including communication devices capable of the free-space optical communication. Each of the communication devices is, for example, an optical transmitter/receiver having a forward error correction function.

One of the communication devices serving as a transmission side includes an interleaving unit (for example, an interleaver) configured to be capable of changing an interleaving length, and a frame synchronization signal generation circuit. The communication device serving as the transmission side determines the interleaving length of transmit data to be transmitted through the free-space optical communication. The interleaving unit interleaves the transmit data based on the determined interleaving length. The communication device serving as the transmission side shapes the interleaved transmit data so as to make the interleaving length detectable on a receiving side of the free-space optical communication. For example, the frame synchronization signal generation circuit included in the communication device appends a frame synchronization signal allowing the receiving side to determine the interleaving length.

Another of the communication devices serving as the receiving side includes a deinterleaving unit (for example, a deinterleaver) configured to be capable of changing the interleaving length, and a frame synchronization signal receiving circuit. The communication devices serving as the receiving side automatically adjusts the interleaving length based on the received frame synchronization signal.

The communication devices included in the communication system may have a function of communicating data exclusively for communication between devices, in addition to payload data. The communication system may be configured to cause the communication devices to negotiate with each other so as to be capable of performing transmission and reception at an interleaving length optimal for the transmission path.

This configuration allows the communication system to achieve the free-space optical communication at a high performance level. For example, the communication system of the present embodiment can change the interleaving length to any length, and therefore, can achieve stable communication by changing the interleaving length according to characteristics of a transmission space.

The above has described the outline of the present embodiment. The following describes a communication system 1 of the present embodiment in detail.

2. CONFIGURATION OF COMMUNICATION SYSTEM

The communication system 1 is, for example, a system for transmitting various types of data, such as packet data. The data transmitted by the communication system 1 may be stream data (for example, broadcasting stream data), such as moving image data or audio data. The broadcasting can also be regarded as a kind of communication.

The communication system 1 includes a plurality of communication devices capable of performing the free-space optical communication, and the communication devices perform the free-space optical communication with one another. The term "free-space optical communication" refers herein to wireless communication performed using light such as infrared light or visible light (for example, an electromagnetic wave having a wavelength ranging from that of infrared rays to that of visible rays). The term "free-space optical communication" can also be called "optical space communication" or "optical wireless communication". The light used for the free-space optical communication may be laser light or synchrotron radiation. In the case of using the infrared light as the light for the free-space optical communication, the light used for the free-space optical communication may be light having a wavelength in a 1500 nm band longer than a wavelength in a 790 nm band used for a compact disc (CD).

The following specifically describes a configuration of the communication system 1.

2-1. Overall Configuration of Communication System

FIG. 1 is a diagram illustrating a configuration example of the communication system according to the embodiment of the present disclosure. The communication system 1 includes a terminal device 10, a server device 20, a communication device 30, and a communication device 40. While the example of FIG. 1 illustrates each of the terminal device 10, the server device 20, the communication device 30, and the communication device 40 as one device, the communication system 1 may include a plurality of the terminal devices 10, the server devices 20, the communication devices 30, and the communication devices 40.

The devices in FIG. 1 may be regarded as devices in a logical sense. In other words, some of the devices in FIG. 1 may be implemented as virtual machines (VMs), containers, or dockers, and may be physically implemented on the same hardware.

In the present embodiment, the concept of the term "communication device" includes not only a portable mobile device (terminal device), such as a mobile terminal, but also a device installed on a structure or a mobile object. The structure and the mobile object themselves may be regarded as the communication devices. The concept of the term "communication device" includes not only a terminal device, but also a base station device and a relay device. The communication device is a kind of a processing device and an information processing device. The communication device can also be called "transmitting device" or "receiving device".

Terminal Device

The terminal device 10 is an information processing device capable of exchanging data with a communication device, such as the communication device 30, having a free-space optical communication function. The terminal device 10 may be the communication device itself having the free-space optical communication function. The terminal device 10 is, for example, a mobile phone, a smart device (smartphone or tablet), a personal digital assistant (PDA), or a personal computer (PC). The terminal device 10 may be a device, such as a professional camera having a communication function, or may be, for example, a motorcycle or an outside broadcast van provided with communication equipment, such as a field pickup unit (FPU). The terminal device 10 may be a machine-to-machine (M2M) device or an Internet of Things (IoT) device. The terminal device 10 can be regarded as a kind of the communication device. The terminal device 10 may be connected to another device (such as the communication device 30) through a wired connection or a wireless connection.

The terminal device 10 may be a mobile device. The term "mobile device" refers herein to a movable information processing device. In this case, the terminal device 10 may be an information processing device installed on a mobile object, or may be the mobile object itself. For example, the terminal device 10 may be a vehicle, such as an automobile, a bus, a truck, or a two-wheeled motor vehicle, that moves on a road, or may be a wireless communication device mounted on the vehicle. The mobile object may be a mobile terminal, or may be a mobile object that moves on land (narrow sense expression of "on the ground"), underground, on water, or underwater. The mobile object may be a mobile object, such as a drone or a helicopter, that moves in the atmosphere, or may be a mobile object, such as an artificial satellite, that moves outside the atmosphere.

The terminal device 10 need not be a device directly used by a person. The terminal device 10 may be a sensor, such as what is called a machine-type communication (MTC) sensor, installed on, for example, a machine in a factory. The terminal device 10 may be a machine-to-machine (M2M) device or an Internet of Things (IoT) device. The terminal device 10 may be a device having a relay communication function, as represented by a device-to-device (D2D) communication function and a vehicle-to-everything (V2X) communication function. The terminal device 10 may be a device called client premises equipment (CPE) used for, for example, wireless backhaul communication.

The terminal device 10 may be an optical communication device having the free-space optical communication function. In this case, the terminal device 10 may have the optical communication function provided by the communication device 30 or the communication device 40 to be described later, and serve as the communication device 30 or the communication device 40. In this case, the terminal device 10 can be regarded as the communication device 30 or the communication device 40 itself.

Server Device

The server device 20 is an information processing device capable of exchanging data with a communication device, such as the communication device 40, having the free-space optical communication function. The server device 20 may be the communication device itself having the free-space optical communication function. For example, the server device 20 is a host computer for use as a server that processes requests from client computers (such as the terminal device 10). The server device 20 may be a PC server, a mid-range server, or a mainframe server. The server device 20 can also be regarded as a kind of the communication device. The server device 20 may be connected to another device (such as the communication device 40) through a wired connection or a wireless connection. The server device 20 can also be called, for example, "cloud server device", "local server device", "management device", or "processing device".

The server device 20 may be an optical communication device having the free-space optical communication function. In this case, the server device 20 may have the optical communication function provided by the communication device 30 or the communication device 40 to be described later, and serve as the communication device 30 or the communication device 40. In this case, the server device 20 can be regarded as the communication device 30 or the communication device 40 itself.

The server device 20 can be used, operated, and/or managed by various entities (subjects). For example, mobile network operators (MNOs), mobile virtual network operators (MVNOs), mobile virtual network enablers (MVNEs), neutral host network (NHN) operators, enterprises, educational institutions (such as school corporations and school boards of local governments), managers of real estates (such as buildings and apartments), and private persons can be assumed as the entities.

The subjects to use, operate, and/or manage the server device 20 are naturally not limited to the above-listed entities. The server device 20 may be installed and/or operated by one business operator, or may be installed and/or operated by one private person. The subjects to install and/or operate the server device 20 are naturally not limited to these subjects. For example, the server device 20 may be installed and/or operated by a plurality of business operators, or installed and/or operated by a plurality of private persons. The server device 20 may be common equipment used by a plurality of business operators or a plurality of private persons. In this case, the equipment may be installed and/or operated by a third party different from the users.

The server device 20 provides a predetermined communication service to the terminal device 10 through an optical communication device, such as the communication device 40. For example, the server device 20 provides, to the terminal device 10 on which a predetermined application program is installed, through wireless communication, an execution service of information processing (hereinafter called "application processing") requested by the application program.

The application processing performed by the server device 20 refers to, for example, information processing, such as recognition processing of an object in an image, at the application layer level that is performed based on a request from a computer program (such as an application)

provided on a mobile device, or performed in cooperation with the computer program. For example, the application processing performed by the server device 20 may be what is called edge processing in edge computing. The application processing differs from processing at any of what are called the physical layer level, the data link layer level, the network layer level, the transport layer level, the session layer level, and the presentation layer level in the OSI reference model. However, if the application processing includes processing, such as image recognition processing, at the application layer level, the application processing may secondarily include the processing at any of the physical layer level to the presentation layer level.

Communication Device (Ground Station)

The communication device 30 is an optical wireless communication device that uses light to wirelessly communicate with the communication device 40 or another communication device 30. The communication device 30 is, for example, an optical communication modem. The communication device 30 is not limited to the optical communication modem. For example, the communication device 30 may be a device corresponding to a wireless base station or a wireless access point. The communication device 30 may be a wireless relay station, or an on-road base station device, such as a road side unit (RSU).

Unlike the communication device 40, the communication device 30 is located on the ground. The communication device 30 can also be called a ground station device. The communication device 30 may be a device itself located on the ground, or may be a device mounted on an object (for example, a structure or a device) located on the ground. For example, the communication device 30 may be a communication device disposed on a structure on the ground, or may be a communication device disposed on a mobile object moving on the ground. More specifically, the communication device 30 may be an antenna installed on a structure, such as a building, and a signal processing device connected to the antenna. The communication device 30 may naturally be a structure or a mobile object itself. The term "on the ground" refers to "on the ground" in the broad sense, including not only "on land" (narrow sense expression of "on the ground"), but also "underground", "on water", and "underwater".

The communication device 30 need not be a fixed object. The communication device 30 may be installed on a mobile object, such as an automobile. The communication device 30 need not be present on land (narrow sense expression of "on the ground"), and may be an object present in the air, such as an aerial vehicle, a drone, or a helicopter, or an object present on the sea or under the sea, such as a ship or a submarine. In this case, the communication device 30 can perform the wireless communication with other fixedly installed communication devices.

The communication device 30 may be a structure itself, or may be a device installed on the structure. The structure is, for example, a building, such as an office building, a house, a steel tower, a station facility, an airport facility, a harbor facility, or a stadium. The concept of the term "structure" includes not only a building, but also a non-building structure, such as a tunnel, a bridge, a dam, a fence, or a steel pole, and equipment, such as a crane, a gate, or a windmill. The concept of the term "structure" includes not only a structure on land (narrow sense expression of "on the ground") or underground, but also a water-surface structure, such as a pier or a mega-float, and an underwater structure, such as oceanographic observation equipment.

The communication device 30 may be a donor base station, or may be a relay station. When the communication device 30 is a relay station, the communication device 30 may be mounted on any device as long as satisfying a relaying function. For example, the communication device 30 may be mounted on a terminal device such as a smartphone, may be mounted on an automobile or a rickshaw, may be mounted on a balloon, an airplane, or a drone, or may be mounted on a home electric appliance such as a television, a game machine, an air conditioner, a refrigerator, or a lighting device. Each of these devices itself may naturally be regarded as the communication device 30.

The communication device 30 may be a fixed station, or may be a mobile station. The mobile station is a wireless communication device configured to be movable. In this case, the communication device 30 may be a device installed on a mobile object, or may be the mobile object itself. For example, a relay station device having mobility can be regarded as the communication device 30 serving as the mobile station. A device, such as a vehicle, a drone, or a smartphone, that originally has the mobility and is provided with a communication function (at least an optical wireless communication function) corresponds to the communication device 30 serving as the mobile station.

The mobile object may herein be a mobile terminal such as a smartphone or a mobile phone. The mobile object may also be a mobile object (for example, a vehicle, such as an automobile, a bicycle, a bus, a truck, a two-wheeled motor vehicle, a train, or a maglev train) that moves on land (narrow sense expression of "on the ground"), or may be a mobile object (such as an underground train) that moves underground (for example, in the tunnel).

The mobile object may also be a mobile object (for example, a vessel, such as a passenger ship, a cargo ship, or a hovercraft) that moves on the water surface, or may be a mobile object (for example, underwater vessel, such as a submersible, a submarine, or an unmanned undersea vehicle) that moves underwater.

The mobile object may also be a mobile object (for example, an aerial vehicle, such as an airplane, an airship, or a drone) that moves in the atmosphere.

The communication device 30 may be a communication device that can float in the air. The communication device 30 may be, for example, an aircraft station device. The aircraft station device is a wireless communication device, such as an aerial vehicle, that can float in the atmosphere (including the stratosphere). The aircraft station device may be a device mounted on, for example, the aerial vehicle, or may be the aerial vehicle itself. The concept of the term "aerial vehicle" includes not only a heavier-than-air aircraft, such as an airplane or a glider, but also a lighter-than-air aircraft, such as a balloon or an airship. The concept of the term "aerial vehicle" includes not only the heavier-than-air aircraft and the lighter-than-air aircraft, but also a rotorcraft, such as a helicopter or an autogyro. The aircraft station device (or the aerial vehicle with the aircraft station device mounted thereon) may be an unmanned aerial vehicle such as a drone.

The concept of the term "unmanned aerial vehicle" also includes unmanned aircraft systems (UAS) and tethered UAS. The concept of the term "unmanned aerial vehicle" includes lighter-than-air (LTA) UAS and heavier-than-air (HTA) UAS. In addition, the concept of the term "unmanned aerial vehicle" also includes high-altitude UAS platforms (HAPs).

As described above, the communication device 30 may be a relay station device (relay device). The relay station device is, for example, an aeronautical station or an earth station.

The aeronautical station is a radio station installed on the ground or on a mobile object that moves on the ground, in order to communicate with the aircraft station device. The earth station is a radio station located on the Earth (including in the air) in order to communicate with a satellite station device. The earth station may be a large earth station, or may be a small earth station such as a very small aperture terminal (VSAT).

The earth station may be a VSAT control earth station (also called "master station" or "hub station"), or may be a VSAT earth station (also called "slave station"). The earth station may also be a radio station installed on a mobile object that moves on the ground. Examples of the earth station mounted on a vessel include earth stations on board vessels (ESV). The earth station may include an aircraft earth station that is installed on an aerial vehicle (including a helicopter) and communicates with the satellite station. The earth station may include an aeronautical earth station that is installed on a mobile object that moves on the ground and communicates with the aircraft earth station through the satellite station. The relay station device may be a portable mobile radio station that communicates with the satellite station and the aircraft station.

The communication device 30 can be used, operated, and/or managed by various entities. For example, the mobile network operators (MNOs), the mobile virtual network operators (MVNOs), the mobile virtual network enablers (MVNEs), the neutral host network (NHN) operators, the enterprises, the educational institutions (such as the school corporations and the school boards of the local governments), the managers of real estates (such as buildings and apartments), and the private persons can be assumed as the entities. The subjects to use, operate, and/or manage the communication device 30 are naturally not limited to the above-listed entities.

The communication device 30 may be installed and/or operated by one business operator, or may be installed and/or operated by one private person. The subjects to install and/or operate the communication device 30 are naturally not limited to these subjects. For example, the communication device 30 may be installed and/or operated by a plurality of business operators, or installed and/or operated by a plurality of private persons. The communication device 30 may be common equipment used by a plurality of business operators or a plurality of private persons. In this case, the equipment may be installed and/or operated by a third party different from the users.

Communication Device (Satellite Station)

The communication device 40 is an optical wireless communication device that uses the light to wirelessly communicate with the communication device 30 or another communication device 40. The communication device 40 is, for example, an optical communication modem. The communication device 40 is not limited to the optical communication modem. For example, the communication device 40 may be a device corresponding to a wireless base station or a wireless access point. The communication device 40 may be a wireless relay station.

Unlike the communication device 30, the communication device 40 is located outside the atmosphere (in the outer space). The communication device 40 is, for example, a device (satellite station device) installed on a mobile object that moves outside the atmosphere (hereinafter, called "space moving object"). The communication device 40 is, for example, a communication device mounted on an artificial satellite. Examples of the space moving object include artificial celestial bodies, such as the artificial satellite, a spacecraft, and a space station. The communication device 40 may be the space moving object itself. For example, the communication device 40 may be the artificial satellite itself. Also in this case, the communication device 40 can be regarded as the satellite station device.

The term "satellite station device" refers herein to a wireless communication device that can float outside the atmosphere. The satellite station device may be a device mounted on the space moving object such as the artificial satellite, or may be the space moving object itself. The satellite serving as the satellite station device may be any of a low earth orbiting (LEO) satellite, a medium earth orbiting (MEO) satellite, a geostationary earth orbiting (GEO) satellite, and a highly elliptical orbiting (HEO) satellite. The satellite station device may naturally be a device mounted on the LEO satellite, the MEO satellite, the GEO satellite, or the HEO satellite.

The communication device 40 can be used, operated, and/or managed by various entities, in the same way as the communication device 30. In the same way as the communication device 30, the communication device 40 may be installed and/or operated by one business operator, or may be installed and/or operated by one private person.

2-2. Specific Configuration Example of Communication System

Figure 2:
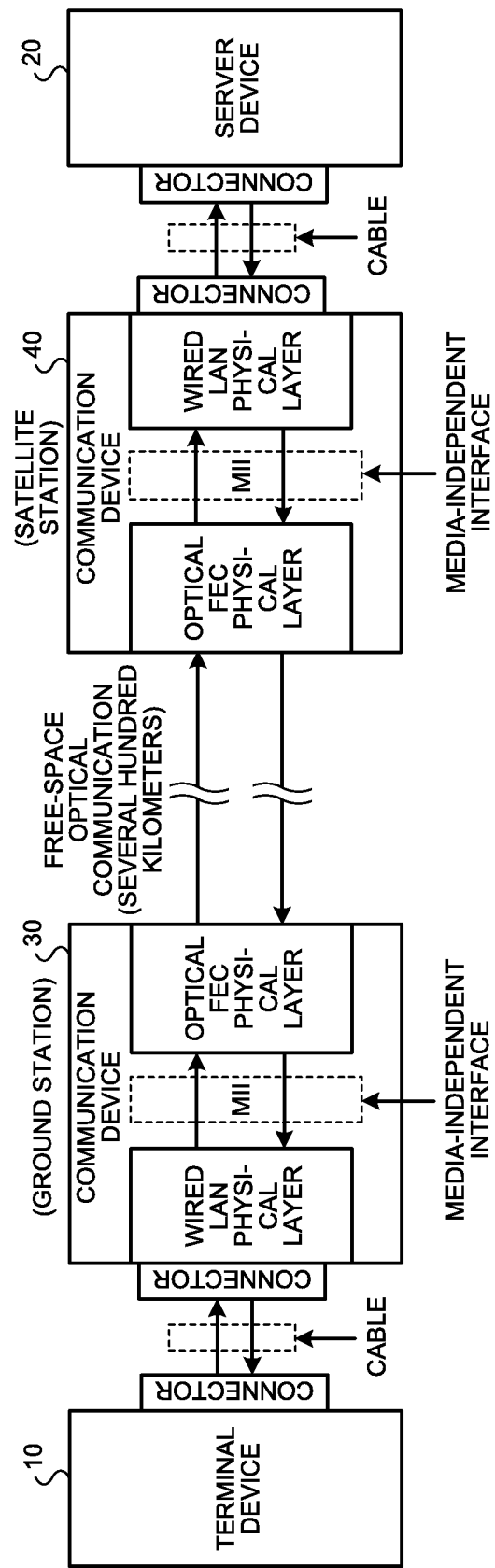
FIG. 2 is a diagram illustrating a specific configuration example of the communication system.

FIG. 2 is a diagram illustrating a specific configuration example of the communication system 1.

The terminal device 10 is, for example, a client PC, and the server device 20 is, for example, a server in an artificial satellite. The communication device 30 is, for example, an optical communication modem serving as a ground station, and the communication device 40 is, for example, an optical communication modem serving as a satellite station. The configuration illustrated in FIG. 2 is merely an example. The configuration of the communication system 1 is not limited to the configuration illustrated in FIG. 2.

In the example of FIG. 2, each of the terminal device 10, the server device 20, the communication device 30, and the communication device 40 is configured to be connectable through a connector, such as an RJ45 connector. The terminal device 10 is connectable to the communication device 30 through a communication cable, such as an Ethernet cable. In the same way, the server device 20 is connectable to the communication device 40 through a communication cable, such as a local area network (LAN) cable.

The communication device 30 and the communication device 40 includes a functional block serving as a wired LAN physical layer and a functional block serving as an optical FEC physical layer, respectively. These functional blocks are connected together through a standard interface, such as a media-independent interface (MII).

The above has described the specific configuration example of the communication system 1. The following specifically describes configurations of the respective devices constituting the communication system 1 according to the embodiment. The configurations of the respective devices to be described below are merely examples. The configurations of the respective devices may differ from those described below.

2-3. Configuration of Terminal Device

First, a configuration of the terminal device 10 will be described. The terminal device 10 is the information processing device capable of exchanging data with a communication device, such as the communication device 30, having the free-space optical communication function. The terminal device 10 may have the free-space optical communication function in the same way as the communication device 30 and the communication device 40. In this case, the terminal device 10 can be regarded as a communication device.

Figure 3:
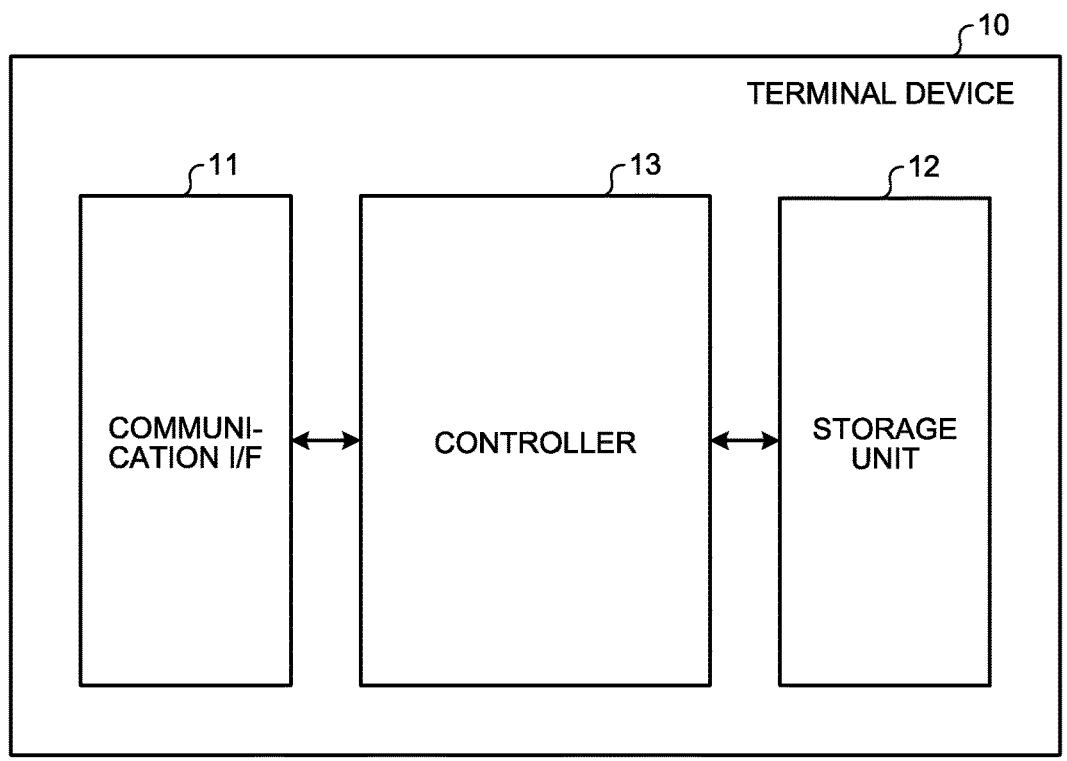
FIG. 3 is a diagram illustrating a configuration example of a terminal device according to the embodiment of the present disclosure.

FIG. 3 is a diagram illustrating a configuration example of the terminal device 10 according to the embodiment of the present disclosure. The terminal device 10 includes a communication interface 11, a storage unit 12, and a controller 13. The configuration illustrated in FIG. 3 is a functional configuration, and hardware may have a different configuration therefrom. Functions of the terminal device 10 may be implemented so as to be distributed over a plurality of physically separated components.

The communication interface 11 is an interface for communicating with another device (for example, the communication device 30). The communication interface 11 may be a network interface, or may be a device connection interface. For example, the communication interface 11 may be a local area network (LAN) interface, such as a network interface card (NIC), or may be a Universal Serial Bus (USB) interface constituted by, for example, a USB interface host controller and a USB port. The communication interface 11 may be a wired interface, or may be a wireless interface. The communication interface 11 serves as a communication unit for the terminal device 10.

The storage unit 12 is a data readable/writable storage device, such as a dynamic random access memory (DRAM), a static random access memory (SRAM), a flash memory, or a hard disk. The storage unit 12 serves as a storage unit for the terminal device 10.

The controller 13 is a controller that controls components of the terminal device 10. The controller 13 is implemented by a processor, such as a central processing unit (CPU) or a microprocessing unit (MPU). For example, the processor uses, for example, a random-access memory (RAM) as a work area to execute various computer programs stored in the storage device in the terminal device 10 to implement the controller 13. The controller 13 may be implemented by an integrated circuit, such as an application specific integrated circuit (ASIC) or a field-programmable gate array (FPGA). Any of the CPU, the MPU, the ASIC, and the FPGA can be regarded as the controller.

The controller 13 may have the same functions as those of either one or both of the controllers of the communication device 30 and the communication device 40 to be described later. For example, the controller 13 may include functional blocks that perform the same operations as those of functional blocks (blocks raging from an acquisition unit to a reception controller) constituting the controller of the communication device 30.

2-4. Configuration of Server Device

The following describes a configuration of the server device 20. The server device 20 is the information processing device capable of exchanging data with a communication device, such as the communication device 40, having the free-space optical communication function. The server device 20 may have the free-space optical communication function in the same way as the communication device 30 and the communication device 40. In this case, the server device 20 can be regarded as a communication device.

Figure 4:
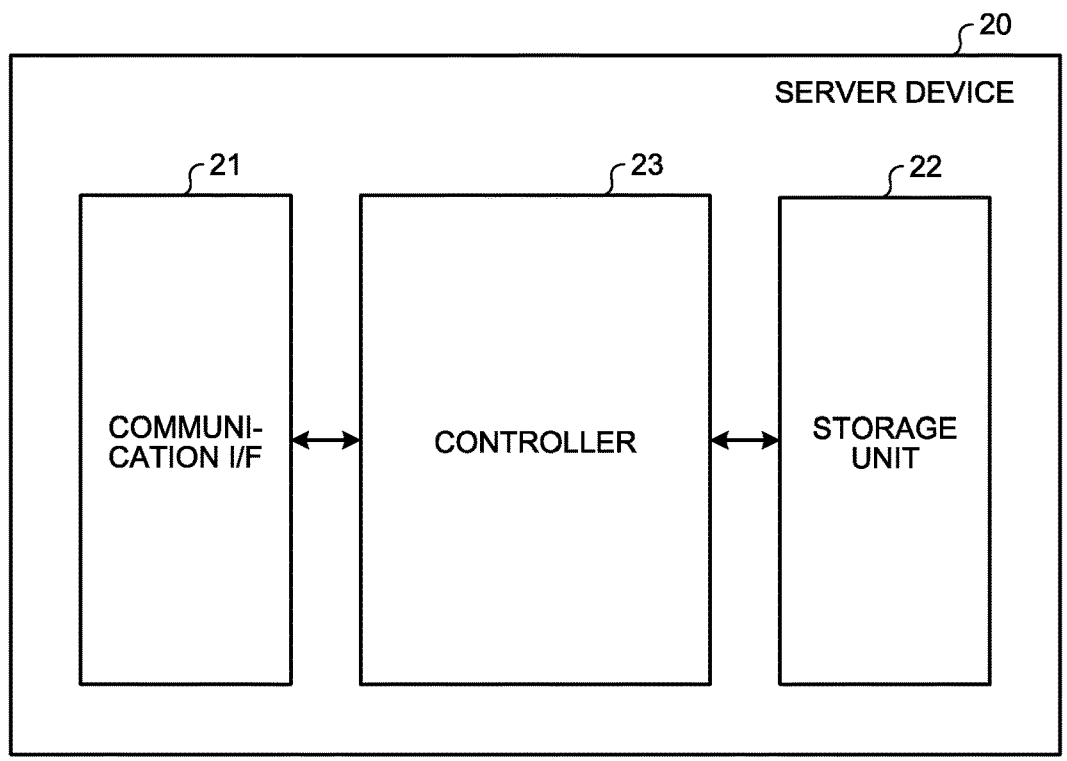
FIG. 4 is a diagram illustrating a configuration example of a server device according to the embodiment of the present disclosure.

FIG. 4 is a diagram illustrating a configuration example of the server device 20 according to the embodiment of the present disclosure. The server device 20 includes a communication interface 21, a storage unit 22, and a controller 23. The configuration illustrated in FIG. 4 is a functional configuration, and hardware may have a different configuration therefrom. Functions of the server device 20 may be implemented so as to be distributed over a plurality of physically separated components.

The communication interface 21 is an interface for communicating with another device (for example, the communication device 40). The communication interface 21 may be a network interface, or may be a device connection interface. For example, the communication interface 21 may be a LAN interface, such as a NIC, or may be a USB interface constituted by, for example, a USB host controller and a USB port. The communication interface 21 may be a wired interface, or may be a wireless interface. The communication interface 21 serves as a communication unit for the server device 20.

The storage unit 22 is a data readable/writable storage device, such as a DRAM, an SRAM, a flash memory, or a hard disk. The storage unit 22 serves as a storage unit for the server device 20.

The controller 23 is a controller that controls components of the server device 20. The controller 23 is implemented by a processor, such as a CPU or an MPU. For example, the processor uses, for example, a RAM as a work area to execute various computer programs stored in the storage device in the server device 20 to implement the controller 23. The controller 23 may be implemented by an integrated circuit, such as an ASIC or an FPGA. Any of the CPU, the MPU, the ASIC, and the FPGA can be regarded as the controller.

The controller 23 may have the same functions as those of either one or both of the controllers of the communication device 30 and the communication device 40 to be described later. For example, the controller 23 may include functional blocks that perform the same operations as those of functional blocks (blocks raging from an acquisition unit to a reception controller) constituting the controller of the communication device 40.

2-5. Configuration of Communication Device (Ground Station)

The following describes a configuration of the communication device 30. The communication device 30 is the optical wireless communication device that uses the light to wirelessly communicate with the communication device 40 or another communication device 30.

Figure 5:
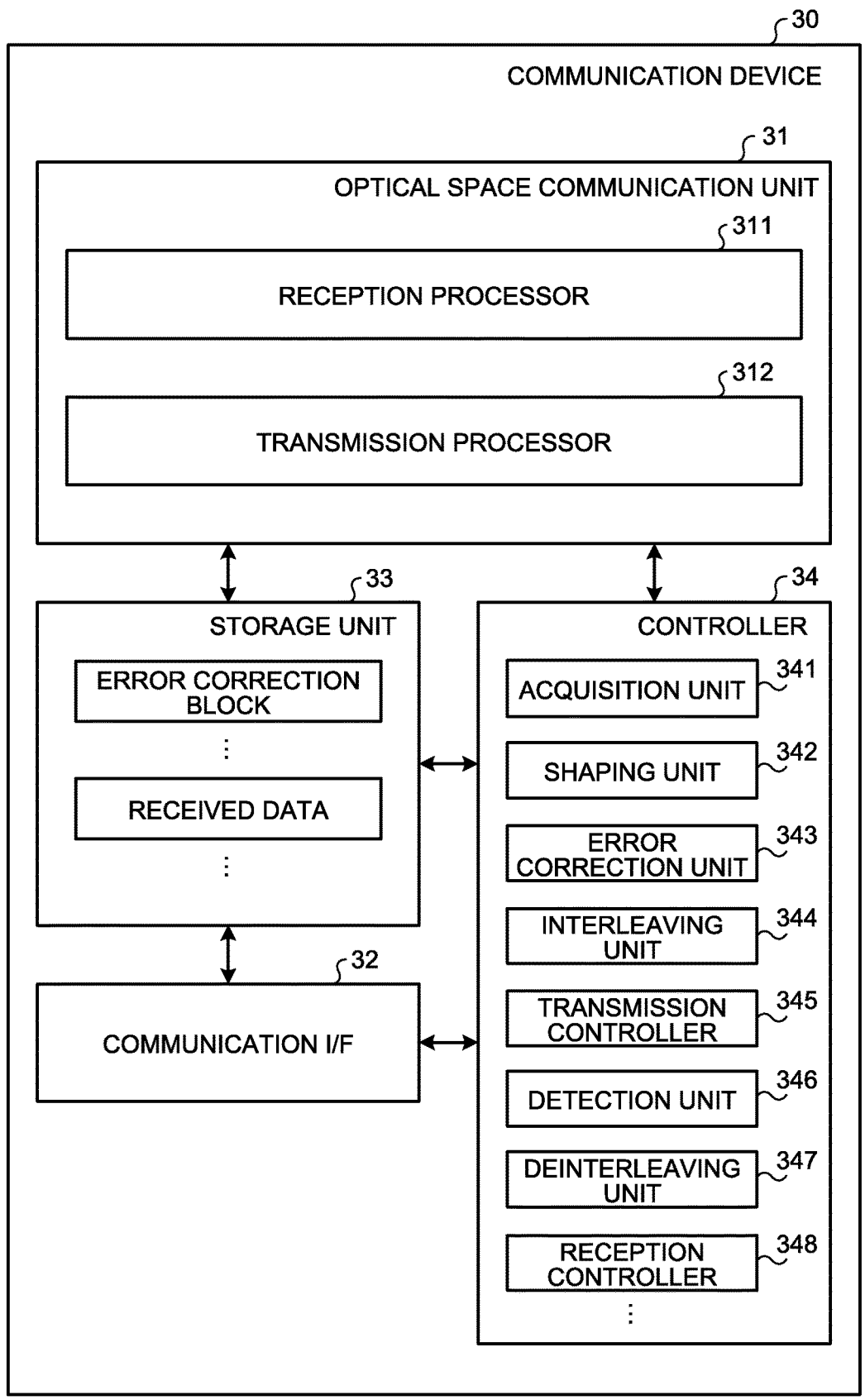
FIG. 5 is a diagram illustrating a configuration example of a communication device according to the embodiment of the present disclosure.

FIG. 5 is a diagram illustrating a configuration example of the communication device 30 according to the embodiment of the present disclosure. The communication device 30 includes an optical space communication unit 31, a communication interface 32, a storage unit 33, and a controller 34. The configuration illustrated in FIG. 5 is a functional configuration, and hardware may have a different configuration therefrom. Functions of the communication device 30 may be implemented so as to be distributed over a plurality of physically separated devices.

The optical space communication unit 31 is a communication interface for performing the free-space optical communication with another communication device (for example, the communication device 40 or another communication device 30) having the free-space optical communication function. A transmission medium used for the free-space optical communication by the optical space communication unit 31 is not limited to the visible light, and may be the infrared light. The light used as the transmission medium by the optical space communication unit 31 may be high-directivity light, such as the laser light. The light used as the transmission medium by the optical space communication unit 31 may naturally be low-directivity light, such as the Radial light.

The optical space communication unit 31 includes a reception processor 311 and a transmission processor 312. The reception processor 311 performs, for example, signal processing of an optical signal received via, for example, a photosensor. The transmission processor 312 performs, for example, signal processing to convert the transmit data into an optical signal. The optical space communication unit 31 may include a plurality of the reception processors 311 and a plurality of the transmission processors 312. When the optical space communication unit 31 supports a plurality of wireless access schemes, the processors of the optical space communication unit 31 can be individually configured for each of the wireless access schemes. For example, when the communication device 30 supports a plurality of wireless access schemes having different error correction methods, the reception processor 311 and the transmission processor 312 may be individually configured for each of the wireless access schemes.

The communication interface 32 is an interface for communicating with another device (for example, the terminal device 10). The communication interface 32 may be a network interface, or may be a device connection interface. For example, the communication interface 32 may be a LAN interface, such as a NIC, or may be a USB interface constituted by, for example, a USB host controller and a USB port. The communication interface 32 may be a wired interface, or may be a wireless interface. The communication interface 32 serves as a communication unit for the communication device 30.

The storage unit 33 is a data readable/writable storage device, such as a DRAM, an SRAM, a flash memory, or a hard disk. The storage unit 33 serves as a storage unit for the communication device 30. The storage unit 33 stores, for example, an error correction block and received data.

The controller 34 is a controller that controls components of the communication device 30. The controller 34 is implemented by a processor, such as a CPU or an MPU. For example, the processor uses, for example, a RAM as a work area to execute various computer programs stored in the storage device in the communication device 30 to implement the controller 34. The controller 34 may be implemented by an integrated circuit, such as an ASIC or an FPGA. Any one of the CPU, the MPU, the ASIC, and the FPGA can be regarded as the controller.

As illustrated in FIG. 5, the controller 34 includes an acquisition unit 341, a shaping unit 342, an error correction unit 343, an interleaving unit 344, a transmission controller 345, a detection unit 346, a deinterleaving unit 347, and a reception controller 348. Each of the blocks (acquisition unit 341 to reception controller 348) constituting the controller 34 is a functional block representing a function of the controller 34. These functional blocks may be software blocks, or may be hardware blocks. For example, each of the above-described functional blocks may be one software module implemented by software (including a microprogram), or may be one circuit block on a semiconductor chip (die). Each of the functional blocks may naturally be one processor or one integrated circuit. Any method may be used to configure the functional blocks. The controller 34 may be configured in functional units different from the above-described functional blocks.

As described above, the controller 13 of the terminal device 10 and the controller 23 of the server device 20 may each include the functional blocks included in the controller 34 of the communication device 30. In this case, the term "communication device 30" to be mentioned in the following description can be replaced with "terminal device 10" or "server device 20" as appropriate. Each of the terms "controller 34" and "acquisition unit 341" to "reception controller 348" to be mentioned in the following description can also be replaced with "controller 13" or "controller 23" as appropriate.

The controller 34 may have the same functions as those of a controller of the communication device 40 to be described later. For example, the operations of the functional blocks (acquisition unit 341 to reception controller 348) of the controller 34 may be the same as those of functional blocks (acquisition unit to reception controller) constituting the controller of the communication device 40. In this case, the terms representing the functional blocks of the controller 34 ("acquisition unit 341" to "reception controller 348") to be mentioned in the following description can be replaced with terms representing the functional blocks of the controller of the communication device 40 as appropriate.

2-6. Configuration of Communication Device (Satellite Station)

The following describes a configuration of the communication device 40. The communication device 40 is the optical wireless communication device that uses the light to wirelessly communicate with the communication device 30 or another communication device 40.

Figure 6:
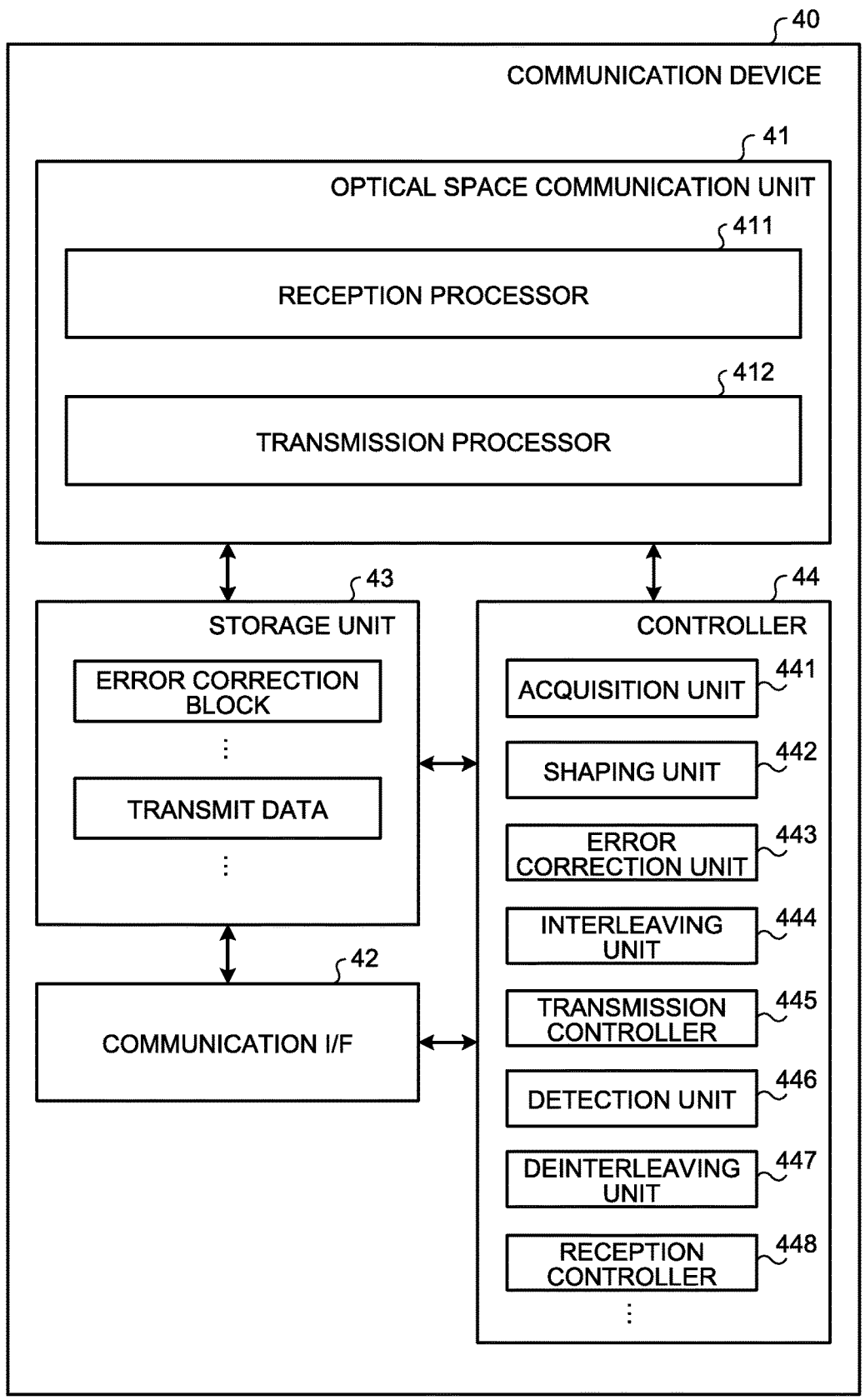
FIG. 6 is a diagram illustrating a configuration example of another communication device according to the embodiment of the present disclosure.

FIG. 6 is a diagram illustrating a configuration example of the communication device 40 according to the embodiment of the present disclosure. The communication device 40 includes an optical space communication unit 41, a communication interface 42, a storage unit 43, and a controller 44. The configuration illustrated in FIG. 6 is a functional configuration, and hardware may have a different configuration therefrom. Functions of the communication device 40 may be implemented so as to be distributed over a plurality of physically separated devices.

The optical space communication unit 41 is a communication interface for performing the free-space optical communication with another communication device (for example, the communication device 30 or another communication device 40) having the free-space optical communication function. The transmission medium used for the free-space optical communication by the optical space communication unit 41 is not limited to the visible light, and may be the infrared light. The light used as the transmission medium by the optical space communication unit 41 may be high-directivity light, such as the laser light. The light used as the transmission medium by the optical space communication unit 41 may naturally be high-directivity light, such as the synchrotron radiation.

The optical space communication unit 41 includes a reception processor 411 and a transmission processor 412. The reception processor 411 performs, for example, the signal processing of an optical signal received via, for example, a photosensor. The transmission processor 412 performs, for example, the signal processing to convert the transmit data into an optical signal. The optical space communication unit 41 may include a plurality of the reception processors 411 and a plurality of the transmission processors 412. When the optical space communication unit 41 supports a plurality of wireless access schemes, the processors of the optical space communication unit 41 can be individually configured for each of the wireless access schemes. For example, when the communication device 40 supports a plurality of wireless access schemes having different error correction methods, the reception processor 411 and the transmission processor 412 may be individually configured for each of the wireless access schemes.

The communication interface 42 is an interface for communicating with another device (for example, the server device 20). The communication interface 42 may be a network interface, or may be a device connection interface. For example, the communication interface 42 may be a LAN interface, such as a NIC, or may be a USB interface constituted by, for example, a USB host controller and a USB port. The communication interface 42 may be a wired interface, or may be a wireless interface. The communication interface 42 serves as a communication unit for the communication device 40.

The storage unit 43 is a data readable/writable storage device, such as a DRAM, an SRAM, a flash memory, or a hard disk. The storage unit 43 serves as a storage unit for the communication device 40. The storage unit 43 stores, for example, an error correction block and received data.

The controller 44 is a controller that controls components of the communication device 40. The controller 44 is implemented by a processor, such as a CPU or an MPU. For example, the processor uses, for example, a RAM as a work area to execute various computer programs stored in a storage device in the communication device 40 to implement the controller 44. The controller 44 may be implemented by an integrated circuit, such as an ASIC or an FPGA. Any of the CPU, the MPU, the ASIC, and the FPGA can be regarded as the controller.

As illustrated in FIG. 6, the controller 44 includes an acquisition unit 441, a shaping unit 442, an error correction unit 443, an interleaving unit 444, a transmission controller 445, a detection unit 446, a deinterleaving unit 447, and a reception controller 448. Each of the blocks (acquisition unit 441 to reception controller 448) constituting the controller 44 is a functional block representing a function of the controller 44. These functional blocks may be software blocks, or may be hardware blocks. For example, each of the above-described functional blocks may be one software module implemented by software (including a microprogram), or may be one circuit block on a semiconductor chip (die). Each of the functional blocks may naturally be one processor or one integrated circuit. Any method may be used to configure the functional blocks. The controller 44 may be configured in functional units different from the above-described functional blocks.

As described above, the controller 13 of the terminal device 10 and controller 23 of the server device 20 may each include the functional blocks included in the controller 44 of the communication device 40. In this case, the term "communication device 40" to be mentioned in the following description can be replaced with "terminal device 10" or "server device 20" as appropriate. Each of the terms "controller 44" and "acquisition unit 441" to "reception controller 448" to be mentioned in the following description can also be replaced with "controller 13" or "controller 23" as appropriate.

The controller 44 may have the same functions as those of the controller 34 of the communication device 30 described above. For example, the operations of the functional blocks (acquisition unit 441 to reception controller 448) of the controller 44 may be the same as those of the functional blocks (acquisition unit 341 to reception controller 348) constituting the controller 34 of the communication device 30. In this case, the terms representing the functional blocks of the controller 44 ("acquisition unit 441" to "reception controller 448") to be mentioned in the following description can be replaced with the terms representing the functional blocks of the controller 34 of the communication device 30 ("acquisition unit 341" to "reception controller 348") as appropriate. The terms representing the functional blocks of the controller 34 ("acquisition unit 341" to "reception controller 348") to be mentioned in the following description may naturally be replaced with the terms representing the functional blocks of the controller 44 of the communication device 40 ("acquisition unit 441" to "reception controller 448").

2-7. Relation in Physical Layer Configuration Between OSI Reference Model and Communication Device In the example of FIG. 2, each of the communication device 30 and the communication device 40 is, for example, a free-space optical modem, and has the wired LAN physical layer and the optical FEC layer. The following describes a relation in physical layer configuration between the OSI reference model and the communication device (either one or both of the communication device 30 and the communication device 40). In this section (2-7), each of the communication device 30 and the communication device 40 is the free-space optical modem, but is naturally not limited to the free-space optical modem.

In the following description, the term "Ethernet" refers not only to Ethernet (registered trademark) as a registered trademark, but also to Ethernet in the broad sense as a standard, such as IEEE 802.3. The term "Ethernet" to be mentioned in the following description can naturally be replaced with, for example, "IEEE 802.3", "IEEE 802.3 Ethernet", "standard network interface", "wired LAN", or "Ethernet as a standard".

Figure 7:
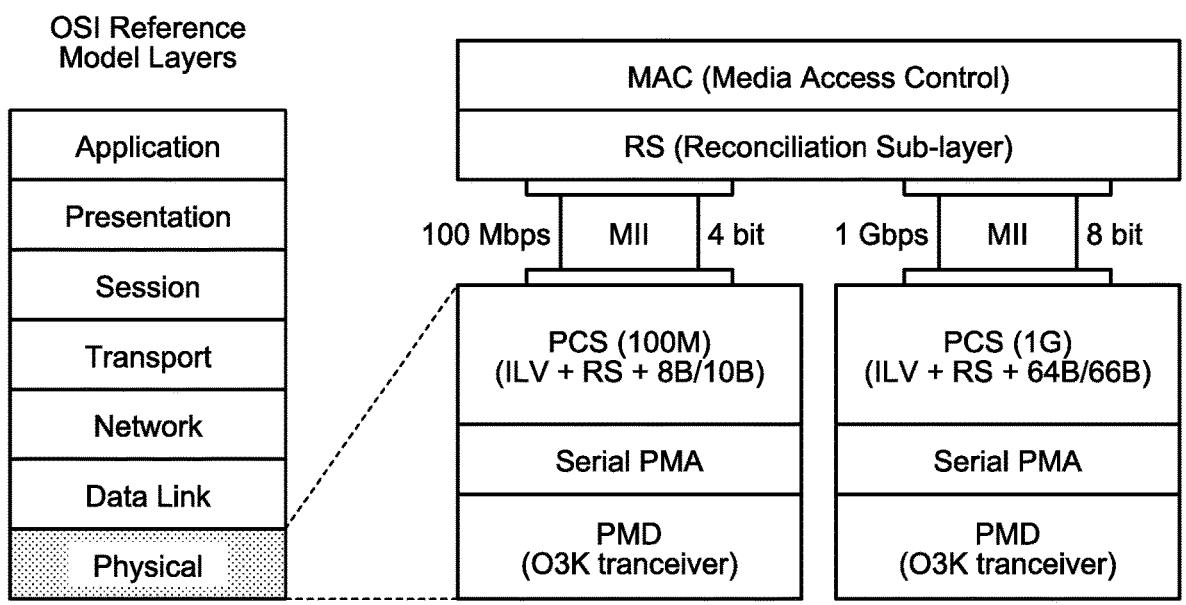
FIG. 7 is a diagram illustrating a relation in physical layer configuration between the Open Systems Interconnection (OSI) reference model and a free-space optical modem.

FIG. 7 is a diagram illustrating the relation in physical layer configuration between the OSI reference model and the free-space optical modem. The free-space optical modem (each of the communication device 30 and the communication device 40) of the present embodiment corresponds to the physical layer of the OSI reference model. The IEEE 802.3 standard as an Ethernet standard defines, for example, the media-independent interface (MII), the gigabit media-independent interface (GMII), the 10-gigabit media-independent interface (XGMII), and the 10-gigabit attachment unit interface (XAUI) as the media-independent interface standard for connecting a media access control (MAC) layer to the physical layer. The free-space optical modem can serve as an Ethernet media converter by connecting the optical FEC physical layer through this interface, and using existing higher-level Ethernet layers as they are.

The optical FEC physical layer included in the free-space optical modem of the present embodiment corresponds to, for example, the Physical Coding Sublayer (PCS) and the Physical Medium Attachment (PMA). The Physical Medium Dependent (PMD) illustrated in FIG. 7 corresponds to, for example, a laser or light modulator, a transmission/reception optical system, or a photodetector.

The embodiment to be described below is targeted at a 100 Mbps network (for example, 100BASE-TX) as an example. However, the target of application of the present embodiment is not limited to the 100 Mbps network, and may be, for example, a 1 Gbps network (for example, 1000BASE-T). When the free-space optical modem of the present embodiment supports the 1 Gbps network (for example, 1000BASE-T), the optical FEC physical layer may be connected to the higher-level layers through the GMII, as illustrated on the right side in FIG. 7. In order to improve error correction capability and redundancy, the parity length or the symbol length of a Reed-Solomon code may be increased, or the data modulation method may be replaced with, for example, 64b/66b encoding. Even in a case where the free-space optical modem of the present embodiment is required to support a higher-speed network such as a 10

Gbps network, as long as the media-independent interface conforms to the Ethernet standard, the free-space optical modem of the present embodiment can serve as the Ethernet media converter even if the error correction method or the block structure is greatly changed.

3. ERROR CORRECTION BLOCK FORMAT

The communication devices 30 and 40 of the present embodiment are configured to be capable of changing the interleaving length. The communication device 30 or the communication device 40 changes the interleaving length according to the characteristics of the transmission space so as to achieve the stable free-space optical communication. The present embodiment employs a data format making the interleaving length detectable so as to allow the receiving side of the free-space optical communication (for example, the communication device 40) to detect the interleaving length used by the transmission side of the free-space optical communication (for example, the communication device 30).

In the present embodiment, as an example, the data format is an error correction block format. The following describes the error correction block format of the present embodiment. A basic error correction block format will first be described. An extended format in the present embodiment will then be described.

3-1. Basic Configuration

Figure 8:
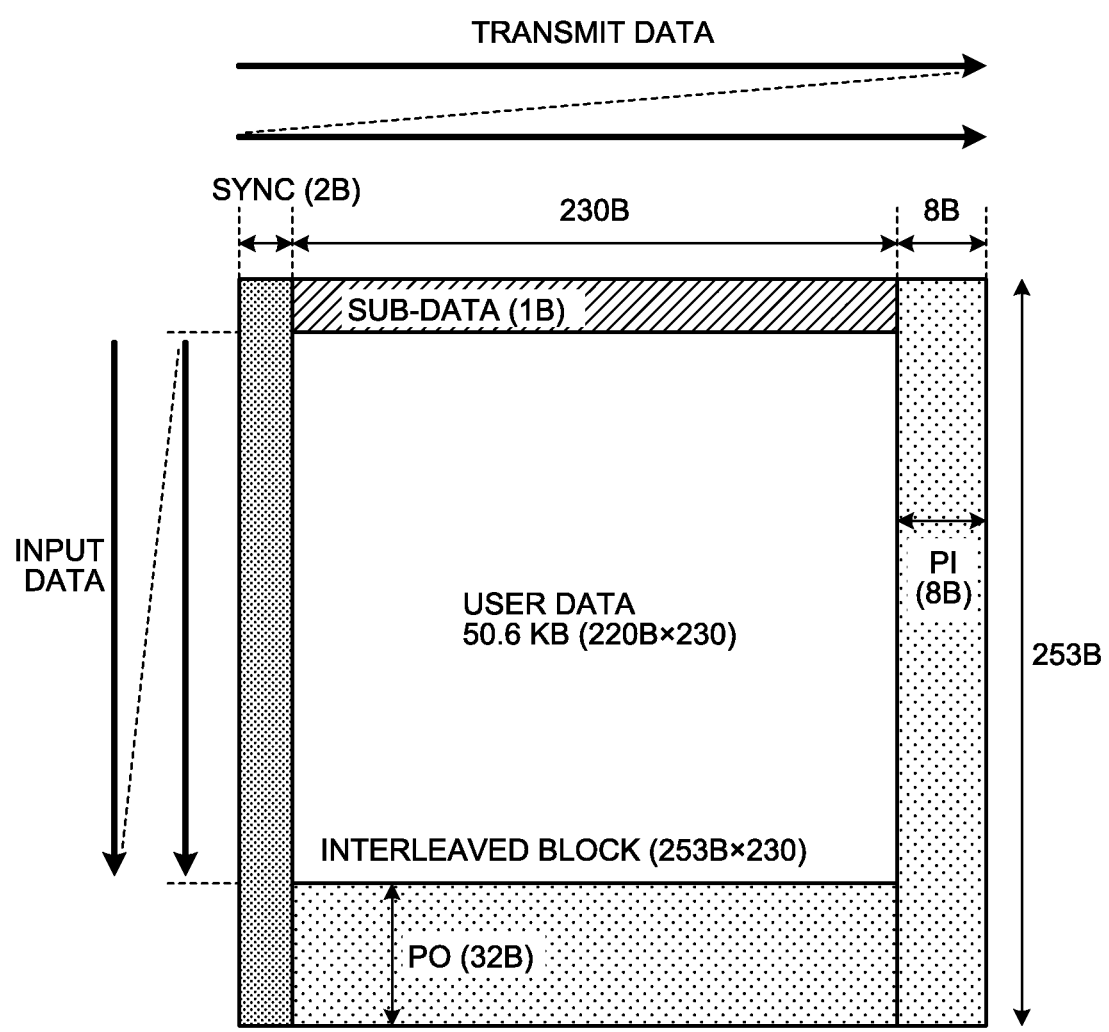
FIG. 8 is a diagram illustrating an example of a block format of a basic block.
Figure 9:
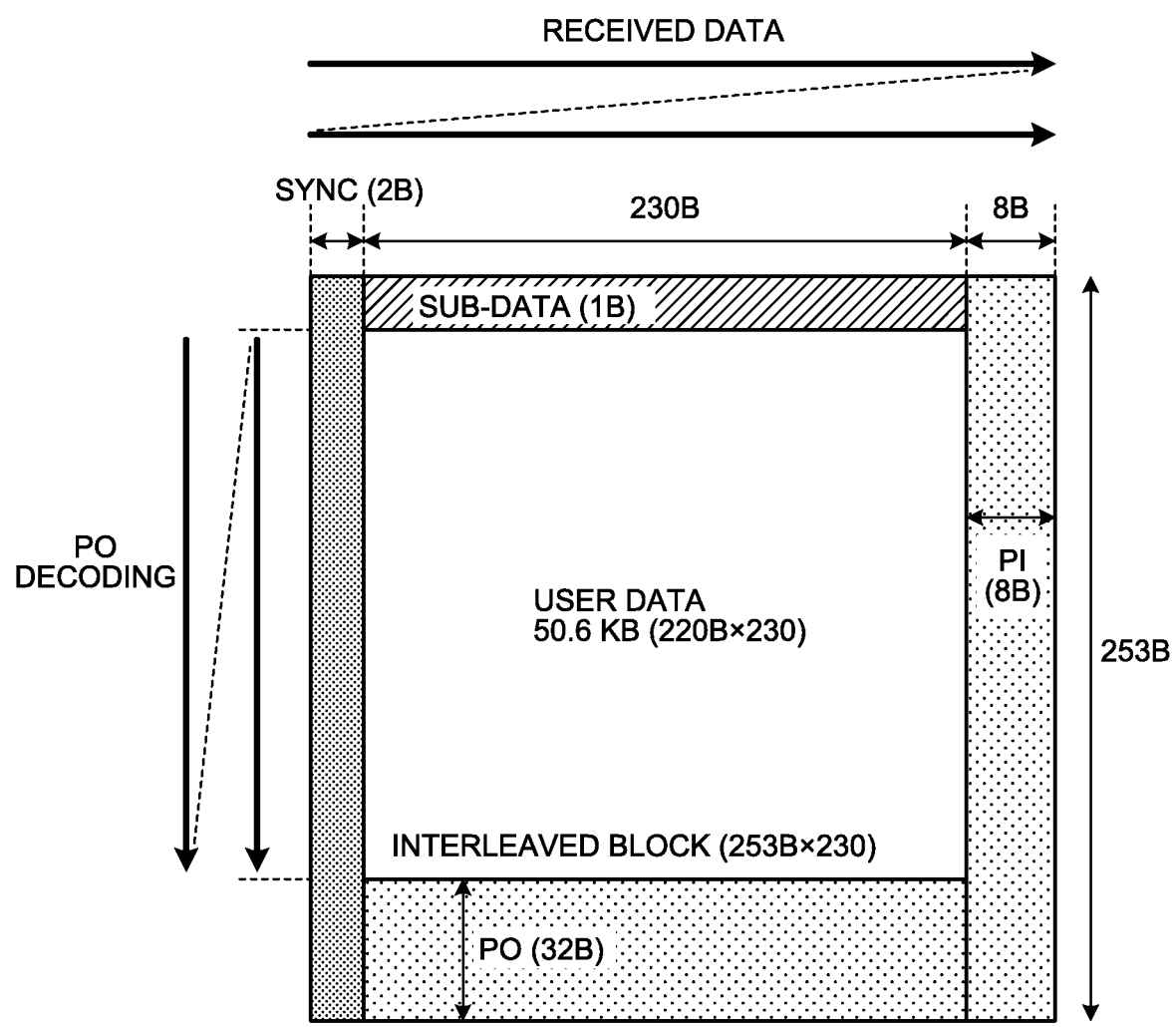
FIG. 9 is a diagram illustrating another example of the block format of the basic block.

First, the basic error correction block format will be described. In the following description, the basic error correction block may be called a basic block. The block format of the basic block is constituted by the error correction block encoded using a product code. FIGS. 8 and 9 are diagrams illustrating examples of the block format of the basic block. The block format illustrated in FIGS. 8 and 9 is a forward error correction format for the free-space optical communication using a Reed-Solomon product code. In the following description, the longitudinal direction of the figure is called the vertical direction, and the lateral direction of the figure is called the horizontal direction.

As illustrated in FIGS. 8 and 9, the basic block has a size of 240 bytes ((2+230+8) bytes) in the horizontal direction and 253 bytes in the vertical direction. A head in the horizon direction (that is, a block boundary) of the basic block is provided with a synchronization code (hereinafter, called a SYNC code). In the example of FIG. 8, two bytes in the horizontal direction serve as the SYNC code. The basic block includes a parity inner (PI) code of eight bytes in the horizontal direction and a parity outer (PO) code of 32 bytes in the vertical direction. An area of 230 bytes interposed between the SYNC code and the PO parity serves as an interleaved block. The interleaved block includes sub-data of one byte in the vertical direction. An area of 50.6 kilobytes obtained by removing the sub-data and the PO from the interleaved block serves as user data (payload data).

The sub-data is data used for exchanging control information between the communication devices, such as the free-space optical modems. The communication system of the present embodiment uses the sub-data superimposed in addition to the payload data so as to be capable of communicating various control signals between the optical modems. For example, a receiver can notify a transmitter of a reception state of, for example, an error rate, so that the transmitter can change the interleaving length for transmission to select an interleaving length optimal for the transmission space. In addition, the transmission side can monitor a received light intensity to perform control to automatically adjust the transmitted light output or correct the transmitted light axis. In this way, using the sub-data transmission enables negotiation between devices, optimization of control, and system operation of, for example, various monitors.

During data transmission, as illustrated in FIG. 8, the error correction block of the present embodiment receives data in the vertical direction, and outputs the transmit data in the horizontal direction. During data reception, as illustrated in FIG. 9, the received data is received in the horizontal direction, and PO decoding is performed in the vertical direction. Therefore, the interleaving length (230 bytes in the examples of FIGS. 8 and 9) increases with the increase in the length in the horizontal direction of the interleaved block.

The Reed-Solomon product code having the PO parity and the PI parity excels in burst error correction capacity, and can further be improved in the error correction capacity by performing erasure correction and repetitive correction, thus being also effective for correcting the burst errors caused by the atmospheric disturbances likely to occur during the free-space optical communication.

The block format illustrated in FIGS. 8 and 9 is merely an example. The error correction block format is not limited to the format illustrated in FIGS. 8 and 9. The specific values illustrated in FIGS. 8 and 9 can be changed as appropriate.

3-2. Extended Configuration

Figure 10:
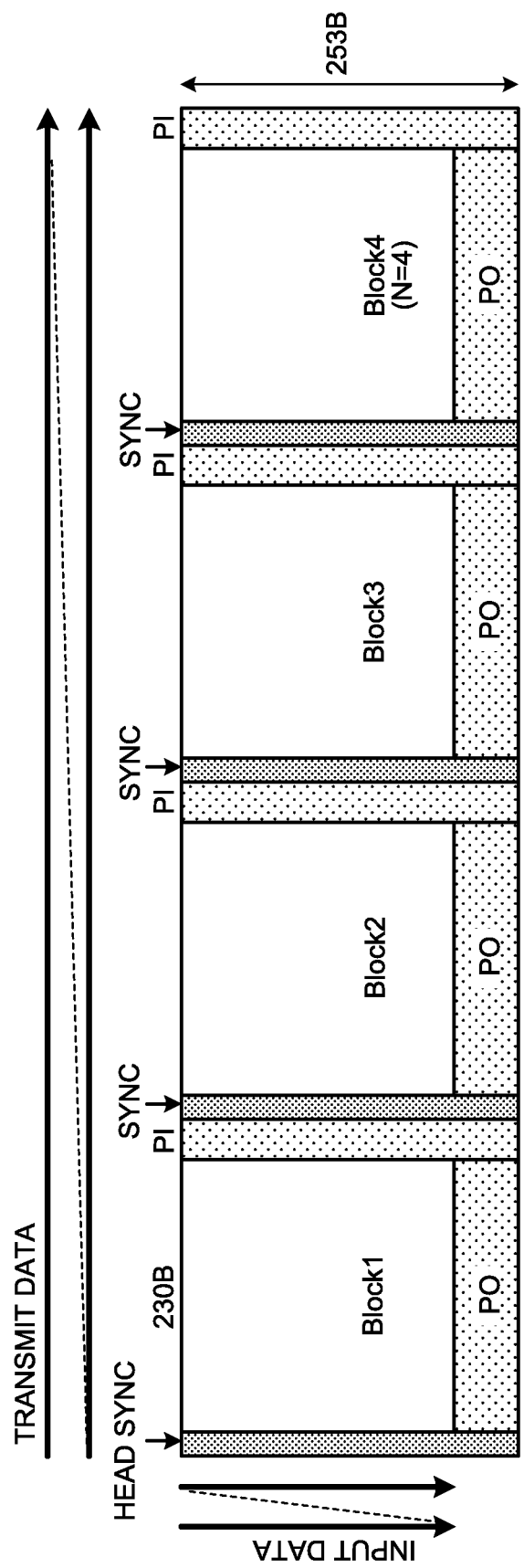
FIG. 10 is a diagram illustrating an error correction block format when an interleaving length has been extended.
Figure 11:
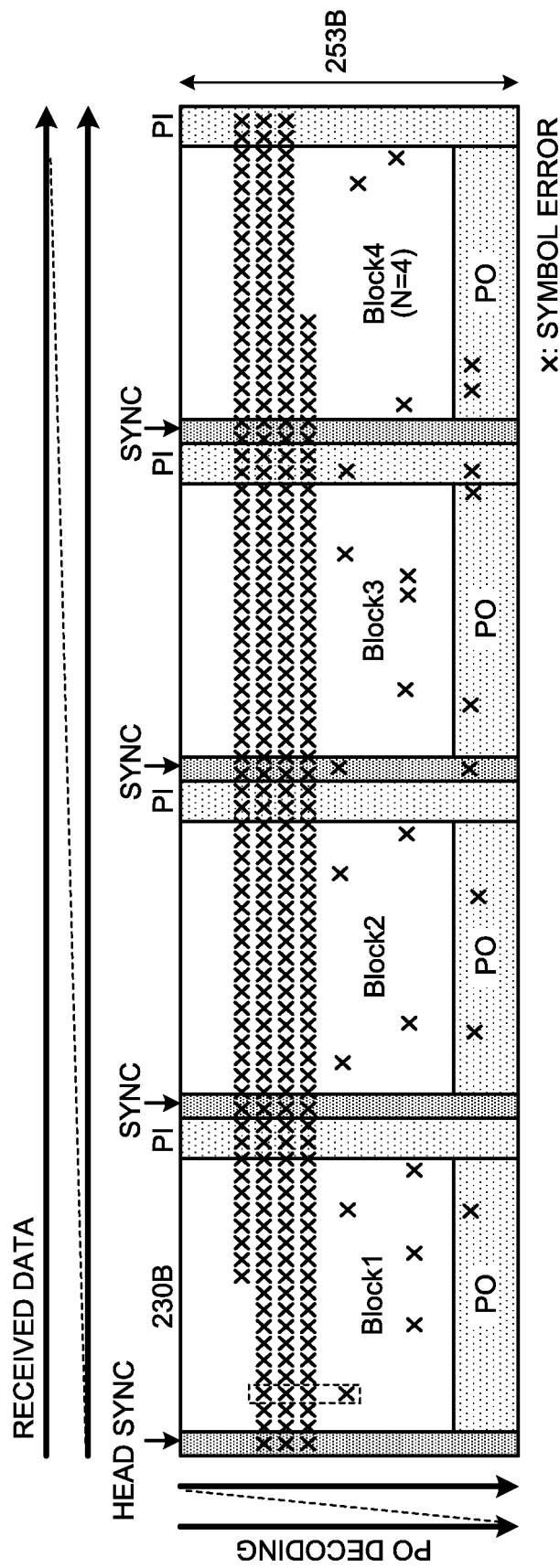
FIG. 11 is another diagram illustrating the error correction block format when the interleaving length is extended.

The extended format in the present embodiment will be described. The extended format described below is an error correction block format in which the interleaving length is extended. FIGS. 10 and 11 are diagrams illustrating the error correction block format when the interleaving length has been extended.

The extended format is a format of a structure obtained by arranging the basic blocks illustrated in FIGS. 8 and 9 in the horizontal direction. In the examples of FIGS. 10 and 11, the basic block is extended to four blocks. In the examples of FIGS. 10 and 11, the interleaving length is four times that of the basic block. As a result, as illustrated in FIG. 11, the deinterleaving disperses the burst errors (each marked by X) across four blocks. This dispersion can also expand the length of burst errors correctable by the PO parity by four times. Increasing the number of the connected blocks can further increase the interleaving length.

While increasing the interleaving length improves resistance to the burst errors, a memory capacity required for the interleaving increases, and a waiting time (latency) of the transmission and reception increases in proportion thereto. Therefore, a mechanism is required to select the optimal interleaving length according to the characteristics of the space (transmission path) through which the actual communication is performed.

The transmission-side communication device can easily change the interleaving length using a mechanism, such as the structure illustrated in FIGS. 10 and 11, that laterally extends the blocks by arranging any number of the basic blocks.

Regarding the SYNC code, to allow the receiving side to detect the interleaving length, the transmission-side communication device assigns a special SYNC code (first synchronization code) to the SYNC code in the head block, and assigns a SYNC code (second synchronization code) different from that in the head block to each of the other blocks. The first synchronization code is a code representing a start point or an end point of the interleaving, and the second synchronization code is a code representing a continuation point of the interleaving.

As a result, the receiving-side communication device can detect the interleaving length used by the transmission side based on a receiving interval of the head SYNC (second synchronization code). This detection allows the receiving-side communication device to automatically match the interleaving length thereof with the interleaving length of the transmission side. As another implementation example, a block number can be embedded in the SYNC code to allow the interleaving length to be detected. Also in this case, the SYNC code with the number representing the head SYNC embedded therein may be regarded as the first code, and a SYNC code with another number embedded therein may be regarded as the second code.

Even when the code of the error correction block format is a convolutional code different from the Reed-Solomon product code of the block format, the interleaving length can be detected from the received SYNC codes, and the interleaving length can be automatically adjusted.

The format illustrated in FIGS. 10 and 11 is merely an example. The error correction block format is not limited to the format illustrated in FIGS. 10 and 11. The specific values illustrated in FIGS. 10 and 11 can be changed as appropriate. The number of the arranged basic blocks is naturally not limited to four, and can be changed as appropriate.

4. OPERATIONS OF COMMUNICATION SYSTEM

The following describes operations of the communication system 1.

4-1. Basic Operation

Figure 12:
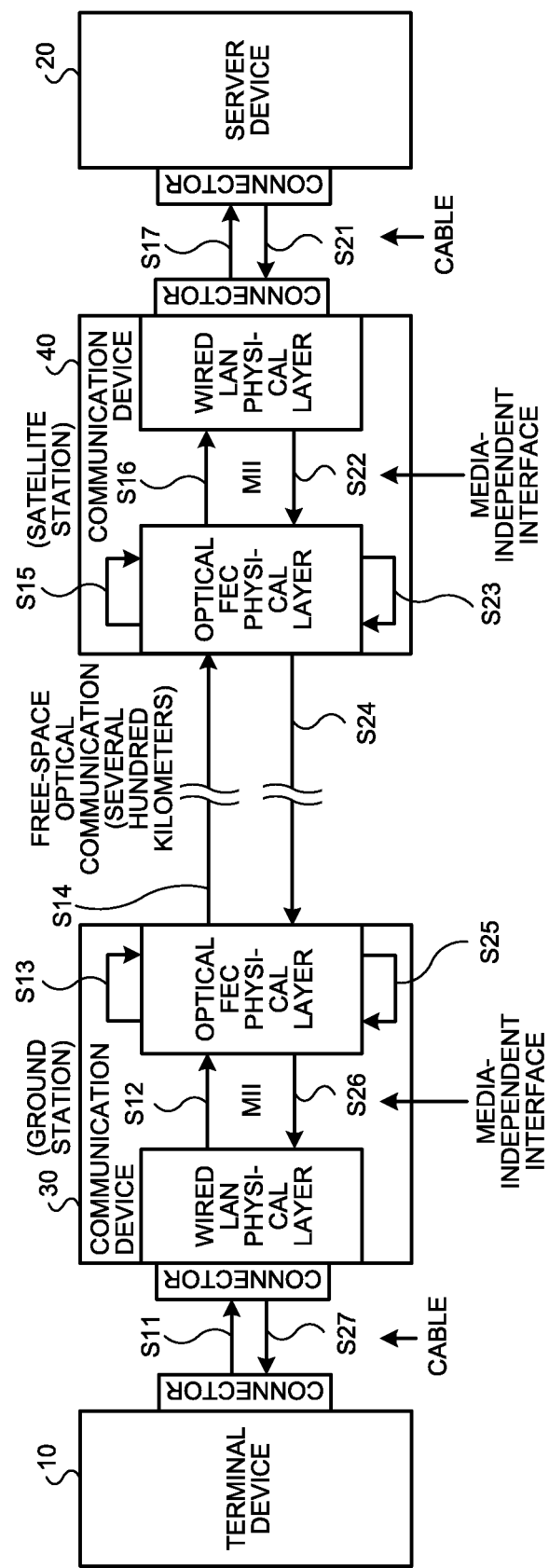
FIG. 12 is a diagram for explaining a basic operation of the communication system.

A basic operation of the communication system 1 will first be described. FIG. 12 is a diagram for explaining the basic operation of the communication system 1.

In the following description, the terminal device 10 is located on the ground, and the server device 20 is located in the artificial satellite. The terminal device 10 is connected to the communication device 30 through the communication cable, and the server device 20 is connected to the communication device 40 through the communication cable. The communication device 30 and the communication device 40 are, for example, the free-space optical communication modems. The following describes a case where the terminal device 10 requests data from the server device 20 using the Transmission Control Protocol/Internet Protocol (TCP/IP) suite.

After the terminal device 10 transmits a TCP packet (GET request) to the communication cable such as the Ethernet cable, the wired LAN physical layer in the communication device 30 receives the packet (Step S11). The wired LAN physical layer transmits the packet through the media-independent interface (MII, GMII, XGMII, or XAUI) to the optical FEC physical layer in the communication device 30 (Step S12). The optical FEC physical layer appends an error correction parity to the received data, and modulates a serial signal to be output after being subjected to, for example, the interleaving processing (Step S13). The optical FEC physical layer transmits output light generated through the modulation toward the distant satellite station (Step S14).

The communication device 40 in the satellite uses a reception detector in the optical FEC physical layer to detect the modulated light output from the communication device 30 on the ground. The optical FEC physical layer in the communication device 40 converts the detected data into parallel data, and then performs the deinterleaving and the error correction processing (Step S15). The optical FEC physical layer transmits the error-corrected data (TCP packet) through the media-independent interface to the wired LAN physical layer in the communication device 40 (Step S16). The wired LAN physical layer delivers the TCP packet to the server device 20 connected to the wired LAN physical layer through the communication cable (Step S17).

The server that has received the TCP packet (GET request) transmits the data requested by the terminal device 10 to the communication device 40. Then, the wired LAN physical layer in the communication device 40 receives the data (Step S21). The wired LAN physical layer transmits the data through the media-independent interface to the optical FEC physical layer in the communication device 40 (Step S22). The optical FEC physical layer appends the error correction parity to the received data, and modulates the serial signal to be output after being subjected to, for example, the interleaving processing (Step S23). The optical FEC physical layer transmits the output light generated through the modulation toward the distant ground station (Step S24).

The communication device 30 located on the ground uses the reception detector in the optical FEC physical layer to detect the modulated light output from the communication device 40 in the satellite. The optical FEC physical layer in the communication device 30 converts the detected data into the parallel data, and then performs the deinterleaving and the error correction processing (Step S25). The optical FEC physical layer transmits the error-corrected data through the media-independent interface to the wired LAN physical layer in the communication device 30 (Step S26). The wired LAN physical layer delivers the data from the server device 20 to the terminal device 10 connected to the wired LAN physical layer through the communication cable (Step S27). Thus, the terminal device 10 can receive the desired data.

This connection configuration through the free-space optical communication causes the communication device 30 and the communication device 40 to serve as the Ethernet media converters, and when viewed from the terminal device 10 and the server device 20, the ground looks as if being connected to the satellite through a wired Ethernet link. This configuration allows the terminal device 10 and the server device 20 to perform the bidirectional data communication.

4-2. Transmit Data Processing

Figure 13:
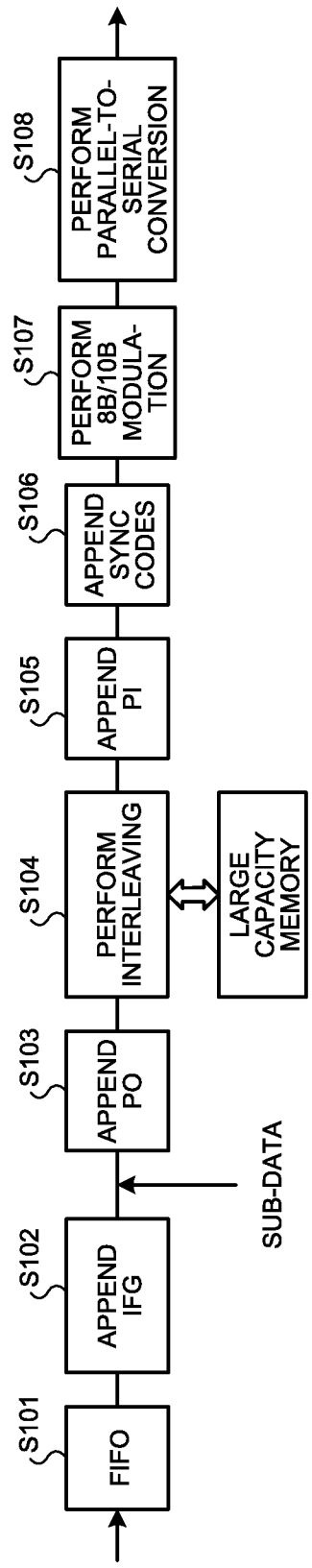
FIG. 13 is a diagram for explaining transmit data processing of the embodiment.

The following describes transmit data processing performed by the optical FEC physical layer. FIG. 13 is a diagram for explaining the transmit data processing of the present embodiment. The transmit data processing to be described below is, for example, the processing at Step S13 or S23 illustrated in FIG. 12.

When the communication device 30 serves as the transmission-side communication device, the transmit data processing is performed by, for example, the acquisition unit 341, the shaping unit 342, the error correction unit 343, the interleaving unit 344, and the transmission controller 345. When the communication device 40 serves as the transmission-side communication device, the transmit data processing is performed by, for example, the acquisition unit 441, the shaping unit 442, the error correction unit 443, the interleaving unit 444, and the transmission controller 445.

In the following description, although the communication device 30 serves as the transmission-side communication device, the transmission-side communication device may be the communication device 40. In that case, the terms, for example, "acquisition unit 341", "shaping unit 342", "error correction unit 343", "interleaving unit 344", and "transmission controller 345" to be mentioned in the following description can be replaced with, for example, "acquisition unit 441", "shaping unit 442", "error correction unit 443", "interleaving unit 444", and "transmission controller 445".

The following describes the transmit data processing with reference to FIG. 13.

The acquisition unit 341 acquires the data output from the wired LAN physical layer through the media-independent interface, and supplies the data to a first-in-first-out unit (FIFO) (Step S101). The shaping unit 342 embeds an inter-frame gap (IFG) signal in each frame boundary, and then appends a predetermined number of bytes (for example, one byte) of the sub-data to be used for control between the communication devices (Step S102). The error correction unit 343 appends a predetermined number of bytes (for example, 32 bytes) of the PO parity serving as the Reed-Solomon code (Step S103).

Then, the interleaving unit 344 determines the interleaving length of the transmit data to be transmitted through the free-space optical communication. The interleaving unit 344 determines the interleaving length based on information on the transmission path of the free-space optical communication to be used for transmitting the transmit data. The information on the transmission path is, for example, information indicating whether the free-space optical communication is communication performed between the ground station and the satellite station or communication performed between the satellite stations. The information on the transmission path may include information indicating whether the free-space optical communication is communication performed between the ground stations.

In the case where the interleaving length is determined based on the information on the transmission path, for example, when the transmission path is between the satellite stations, the interleaving unit 344 determines the interleaving length to be a first interleaving length (for example, an interleaving length for one block). When the transmission path is between the ground station and the satellite station, the burst errors are considered to be likely to occur. Therefore, the interleaving unit 344 determines the interleaving length to be a second interleaving length (for example, an interleaving length for four blocks) longer than the first interleaving length. When the transmission path is between the ground stations, the interleaving unit 344 determines the interleaving length to be a third interleaving length (for example, an interleaving length for two blocks) longer than the first interleaving length and shorter than the second interleaving length. The interleaving length is not limited to these examples, and may have various values. The transmission path is also not limited to between the satellite stations, between the ground station and the satellite station, or between the ground stations.

The information used by the interleaving unit 344 to determine the interleaving length is not limited to the information on the transmission path. The interleaving unit 344 may determine the interleaving length based on, for example, information on the error rate during the communication with the receiving side of the free-space optical communication. For example, if the error rate is lower than a predetermined threshold, the interleaving unit 344 determines the interleaving length to be a fourth interleaving length (for example, an interleaving length for one block). If, in contrast, the error rate is higher than the predetermined threshold, the optical communication is considered to be that performed in a transmission space in which an error is unlikely to occur. Therefore, the interleaving unit 344 determines the interleaving length to be a fifth interleaving length (for example, an interleaving length for four blocks) longer than the fourth interleaving length. The interleaving length is not limited to these examples, and may have various values. A plurality of the predetermined thresholds may be provided, and a plurality of the interleaving lengths may be prepared in accordance with the error rates.

The information used for determining the interleaving length, such as the information on the transmission path or the information on the error rate, may be acquired from the sub-data included in the data received from the other communication device. For example, the acquisition unit 341 may acquire the sub-data included in the error correction block, and the interleaving unit 344 may determine the interleaving length based on the information (for example, the error rate) included in the sub-data acquired by the acquisition unit 341.

The interleaving unit 344 subsequently interleaves the transmit data based on the determined interleaving length (Step S104).

Then, the shaping unit 342 shapes the interleaved transmit data so as to make the interleaving length detectable on the receiving side of the free-space optical communication. For example, the shaping unit 342 appends the PI parity and the SYNC data to the interleaved transmit data (Step S105, S106). At this time, as described in the above section "3-2. Extended Configuration", the shaping unit 342 disposes the first synchronization code at a place representing the start point (or the end point) of the interleaving and the second synchronization code at a place representing the continuation point of the interleaving.

Then, the transmission controller 445 performs 8b/10b modulation on the transmit data (Step S107). In addition, the transmission controller 445 performs parallel-to-serial conversion on the data subjected to the 8b/10b modulation (Step S108). As a result, a modulation signal including a smaller amount of direct-current (DC) component is supplied to an optical modulation unit, and the transmission controller 445 can output modulated transmission light. An encoding scheme other than the 8b/10b encoding may be used, such as a 64b/66b encoding scheme. Otherwise, for example, a randomizer (scrambler) may be used.

4-3. Received Data Processing

Figure 14:
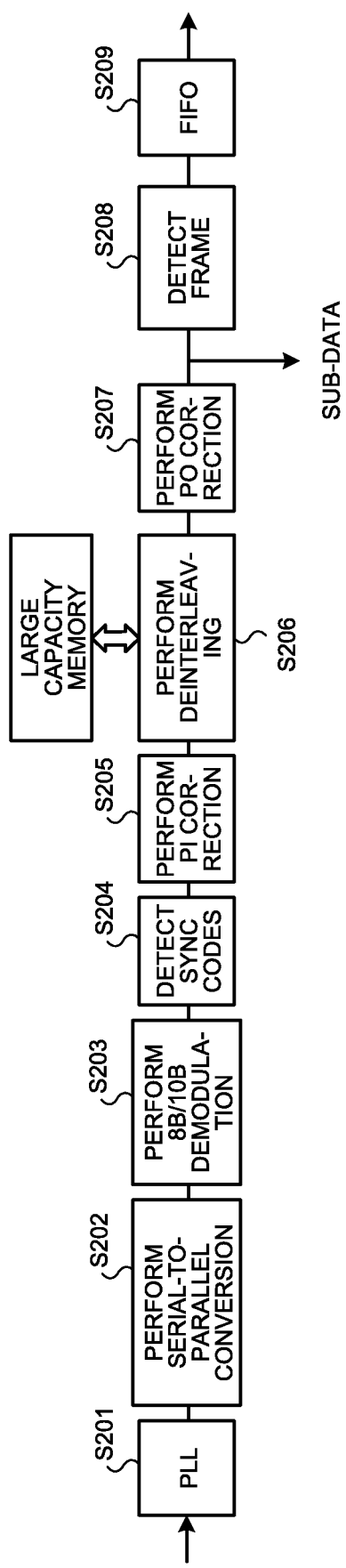
FIG. 14 is a diagram for explaining received data processing of the embodiment.

The following describes received data processing performed by the optical FEC physical layer. FIG. 14 is a diagram for explaining the received data processing of the present embodiment. The received data processing to be described below is, for example, the processing at Step S15 or S25 illustrated in FIG. 12.

When the communication device 40 serves as the receiving-side communication device, the received data processing is performed by, for example, the detection unit 446, the deinterleaving unit 447, and the reception controller 448. When the communication device 30 serves as the receiving-side communication device, the received data processing is performed by, for example, the detection unit 346, the deinterleaving unit 347, and the reception controller 348.

In the following description, although the communication device 40 serves as the receiving-side communication device, the receiving-side communication device may be the communication device 30. In that case, the terms, for example, "detection unit 446", "deinterleaving unit 447", and "reception controller 448" to be mentioned in the following description can be replaced with, for example, "detection unit 346", "deinterleaving unit 347", and "reception controller 348".

The following describes the received data processing with reference to FIG. 14.

The reception controller 448 uses a phase-locked loop (PLL) circuit to extract a synchronizing clock from a serial data string received by the photodetector (Step S201), and converts the serial data into parallel data (Step S202). The reception controller 448 then performs 8b/10b demodulation (Step S203).

The received data has been shaped such that the interleaving length is detectable therefrom. Specifically, the first synchronization code is disposed at the place representing the start point (or the end point) of the interleaving, and the second synchronization code is disposed at the place representing the continuation point of the interleaving. The detection unit 346 detects the SYNC codes to identify the interleaving length (Step S204).

The deinterleaving unit 447 uses a PI correction circuit to perform the error correction on the demodulated data (Step S205), and performs the deinterleaving processing based on the interleaving length detected by the detection unit 346 (Step S206). Then, the reception controller 448 performs PO correction (Step S207). The deinterleaving disperses the burst errors, and thereby can increase the capacity of the burst error correction using the PO parity.

The reception controller 448 then extracts the sub-data to detect the frame boundary (IFG) (Step S208). The reception controller 448 uses the FIFO to remove a clock frequency error (Step S209). The reception controller 448 transmits the received data to the wired LAN physical layer.

5. MODIFICATIONS

The above-described embodiment merely illustrates an example, and various modifications and applications thereof can be made.

5-1. Modifications in Terms of Processing

For example, in the above-described embodiment, the free-space optical communication performed by the communication devices is the communication performed between the ground station and the satellite station (for example, the communication performed between the communication device 30 and the communication device 40). However, the free-space optical communication may be the communication performed between the satellite stations (for example, communication performed between the communication devices 40). The free-space optical communication may be the communication performed between the ground stations (for example, communication performed between the communication devices 30).

In the above-described embodiment, the data format configured to make the interleaving length detectable is the error correction block format, but is not limited to the error correction block format, and may be another data format constituted by one or a plurality of data blocks. In that case, SYNC codes, such as the first synchronization code and the second synchronization code, may be appended to the data block or blocks.

In the above-described embodiment, the error correction block format is that of the error correction block encoded using the Reed-Solomon product code. However, the encoding scheme is not limited to that using the Reed-Solomon product code. The encoding scheme may use another product code. The code used in the encoding scheme is not limited to the product code, and may be another block code.

In the above-described embodiment, an Ethernet frame directly serves as the payload data. However, the Ethernet frame may be replaced with a Generic Framing Procedure (GFP) frame (ITU-T Recommendation G.7041/Y.1303). As a result, since the GFP frame can accommodate various client signals including the Ethernet signals, versatility of the free-space optical communication network can be increased.

5-2. Modifications in Terms of Device Configuration

In the above-described embodiment, the terminal device 10 and the server device 20 exchange information through the free-space optical communication. However, the devices that exchange information through the free-space optical communication are not limited to the terminal device 10 and the server device 20. Information processing devices other than the terminal device 10 and the server device 20 may exchange information. For example, a sensor device and another sensor device may exchange information through the free-space optical communication.

The terminal device 10 and another terminal device 10 may exchange information through the free-space optical communication. The server device 20 and another server device 20 may exchange information through the free-space optical communication.

In the above-described embodiment, the terminal device 10 is located on the ground, and the server device 20 is located in the outer space. However, the server device 20 may be located on the ground, and the terminal device 10 may be located in the outer space. For example, the server device 20 may be located in a base station on the ground, and the terminal device 10 may be located in a space station.

5-3. Other Modifications

A control device for controlling each of the terminal device 10, the server device 20, the communication device 30, and the communication device 40 may be implemented by a dedicated computer system or a general-purpose computer system.

For example, a communication program for executing the above-described operations (for example, the transmission/reception processing) is delivered by being stored in a computer-readable recording medium, such as an optical disc, a semiconductor memory, a magnetic tape, or a flexible disk. The communication program is installed, for example, on a computer, and executes the above-described processing to configure the control device. In that case, the control device may be a device (for example, a personal computer) outside the terminal device 10, the server device 20, the communication device 30, or the communication device 40. Alternatively, the control device may be a device (for example, the controller 13, 23, 34, or 44) inside the terminal device 10, the server device 20, the communication device 30, or the communication device 40.

The above-described communication program may be stored on a disk device provided on a server device on a network such as the Internet so as to be, for example, downloadable to the computer. The above-described functions may be provided by cooperation between an operating system (OS) and application software. In that case, parts other than the OS may be delivered by being stored in a medium, or the parts other than the OS may be stored in the server device so as to be, for example, downloadable to the computer.

All or some of the processes described in the above embodiment that have been described as being automatically executed can be manually executed, or all or some of the processes described as being manually executed can be automatically executed using known methods. In addition, the information including procedures, specific names, various types of data, and parameters illustrated in the document and the drawings can be freely changed unless otherwise specified. For example, the various type of information illustrated in the drawings are not limited to those illustrated in the drawings.

The illustrated components of the devices are merely functionally conceptual, and need not be physically configured as illustrated in the drawings. In other words, the specific mode of distribution and integration of the devices is not limited to those illustrated in the drawings, and all or some of the devices can be configured in a functionally or physically distributed or integrated manner in any units according to various types of loads or use conditions.

The above-described embodiment can be combined as appropriate within a range not causing contradiction in processing details. The order of the steps illustrated in each of the flowcharts and the sequence diagrams in the above-described embodiment can be changed as appropriate.

For example, the present embodiment can also be implemented as any of all components constituting the device or the system, including, for example, a processor as, for example, a system large-scale integrated (LSI) circuit, a module using a plurality of the processors, a unit using a plurality of the modules, or a set obtained by further adding other functions to the unit (that is, some components of the device).

In the present embodiment, the term "system" refers to a set of components (for example, devices, and/or modules (parts)), regardless of whether all the components are in the same housing. Accordingly, a plurality of devices accommodated in separate housings and connected together through a network, and one device obtained by accommodating a plurality of modules in one housing are both referred to as "system".

The present embodiment can have, for example, a cloud computing configuration in which a plurality of devices share and cooperate to process one function through a network.

6. CONCLUSION

As described above, according to one embodiment of the present disclosure, the communication device (for example, the communication device 30 or 40) determines the interleaving length of the transmit data to be transmitted through the free-space optical communication, and interleaves the transmit data based on the determined interleaving length. The communication device shapes the interleaved transmit data so as to make the interleaving length detectable on the receiving side of the free-space optical communication.

With this configuration, the communication device of the present embodiment can change the interleaving length to any length, and therefore, can achieve the stable communication by changing the interleaving length according to the characteristics of the transmission space.

Since the communication device of the present embodiment uses the Reed-Solomon product code in the forward error correction system, relatively simple implementation can ensure sufficient communication stability against the burst errors caused by the atmospheric disturbances.

Arranging the basic blocks makes the interleaving length easily changeable, and allows the receiving side to detect and determine the interleaving length by determining the SYNC codes, and thus to decode the received data. Thereby, the interleaving length can be very easily changed to any length according to the characteristics of the transmission space.

The communication device of the present embodiment supports a variable-length frame, and ensures compatibility with the Ethernet physical layer, and therefore, serves as the Ethernet media converter. As a result, the currently widely used higher-level Ethernet layers can be used as they are. Thus, resources and risks involved in introduction of the communication system can be greatly reduced.

Since the communication device of the present embodiment can superimpose the sub-data used between devices in addition to the payload data, various types of the control information can be exchanged between the optical communication devices. As a result, for example, the interleaving length, the transmission output, and the transmitted light axis can be optimized in real time, and the stable free-space optical communication can be maintained.

While the embodiment of the present disclosure has been described above, the technical scope of the present disclosure is not limited to the above-described embodiment as it is, and can be variously changed within a scope not deviating from the gist of the present disclosure. The components ranging over different embodiments and modifications may be combined as appropriate.

The effects in the embodiment described herein are merely examples, and are not limited thereto. Other effects may be provided.

The present technology can also have the following configurations.

(1)

A communication device comprising:

an interleaving unit configured to determine an interleaving length of transmit data to be transmitted through free-space optical communication, and interleave the transmit data based on the determined interleaving length; and a shaping unit configured to shape the interleaved transmit data so as to make the interleaving length detectable on a receiving side of the free-space optical communication.

(2)

The communication device according to (1), wherein the shaping unit is configured to shape the interleaved transmit data based on a data format configured to make the interleaving length detectable on the receiving side of the free-space optical communication.

(3)

The communication device according to (2), wherein the data format is such that the transmit data includes synchronization codes, and the shaping unit is configured to dispose at least two types of the synchronization codes in the transmit data so as to make the interleaving length detectable on the receiving side of the free-space optical communication.

(4)

The communication device according to (3), wherein the shaping unit is configured to dispose either of a first synchronization code representing a start point or an end point of the interleaving and a second synchronization code representing a continuation point of the interleaving at intervals of a predetermined data length based on the determined interleaving length.

(5)

The communication device according to (4), wherein the data format is a block format including one or a plurality of data blocks, the block format includes the data block or blocks each with a synchronization code disposed at a block boundary thereof, and the shaping unit is configured to dispose either of the first synchronization code and the second synchronization code at the block boundary based on the determined interleaving length.

(6)

The communication device according to (5), wherein the block format is a format including an error correction block encoded using a block code.

(7)

The communication device according to (6), wherein the block format is a format including an error correction block encoded using a product code.

(8)

The communication device according to (7), wherein the block format is a format including an error correction block encoded using a Reed-Solomon product code.

(9)

The communication device according to any one of (1) to (8), wherein the interleaving unit is configured to determine the interleaving length based on information on a transmission path of the free-space optical communication used for transmitting the transmit data.

(10)

The communication device according to (9), wherein the interleaving unit is configured to determine the interleaving length based on information indicating at least whether the free-space optical communication is communication performed between a ground station and a satellite station, or communication performed between the satellite stations.

(11)

The communication device according to (9), wherein the interleaving unit is configured to determine the interleaving length based on information on an error rate during the communication with the receiving side of the free-space optical communication.

(12)

The communication device according to any one of (1) to (11), wherein the transmit data includes, in addition to first data serving as payload data, second data used for exchanging control information between communication devices for the free-space optical communication, and the interleaving unit is configured to determine the interleaving length based on the second data.

(13)

A communication device comprising:

a detection unit configured to detect an interleaving length of received data that has been received through free-space optical communication and has been shaped such that the interleaving length is detectable therefrom; and a deinterleaving unit configured to deinterleave the received data based on the detected interleaving length.

(14)

A communication method comprising:

determining an interleaving length of transmit data to be transmitted through free-space optical communication;

interleaving the transmit data at the determined interleaving length; and shaping the interleaved transmit data so as to make the interleaving length detectable on a receiving side of the free-space optical communication.

(15)

A communication program for causing a computer to function as:

an interleaving unit that determines an interleaving length of transmit data to be transmitted through free-space optical communication, and interleaves the transmit data at the determined interleaving length; and a shaping unit that shapes the interleaved transmit data so as to make the interleaving length detectable on a receiving side of the free-space optical communication.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A communication device comprising:
interleaving circuitry configured to determine an interleaving length of transmit data to be transmitted through free-space optical communication, and interleave the transmit data based on the determined interleaving length; and
shaping circuitry configured to shape the interleaved transmit data so as to make the interleaving length detectable on a receiving side of the free-space optical communication,
wherein the interleaving circuitry is configured to determine the interleaving length based on information on a transmission characteristic of the free-space optical communication used for transmitting the transmit data, and
wherein the information on a transmission characteristic comprises information indicating that the free-space optical communication is:
communication performed between a ground station and a satellite station, or
communication performed between satellite stations, or
communication performed between ground stations.

2. The communication device according to claim 1, wherein the shaping circuitry is configured to shape the interleaved transmit data based on a data format configured to make the interleaving length detectable on the receiving side of the free-space optical communication.

3. The communication device according to claim 2, wherein
the data format is such that the transmit data includes synchronization codes, and
the shaping circuitry is configured to dispose at least two types of the synchronization codes in the transmit data so as to make the interleaving length detectable on the receiving side of the free-space optical communication.

4. The communication device according to claim 3, wherein the shaping circuitry is configured to dispose either of a first synchronization code representing a start point or an end point of the interleaving and a second synchronization code representing a continuation point of the interleaving at intervals of a predetermined data length based on the determined interleaving length.

5. The communication device according to claim 4, wherein
the data format is a block format including one or a plurality of data blocks,
the block format includes the data block or blocks each with a synchronization code disposed at a block boundary thereof, and
the shaping circuitry is configured to dispose either of the first synchronization code and the second synchronization code at the block boundary based on the determined interleaving length.

6. The communication device according to claim 5, wherein the block format is a format including an error correction block encoded using a block code.

7. The communication device according to claim 6, wherein the block format is a format including an error correction block encoded using a product code.

8. The communication device according to claim 7, wherein the block format is a format including an error correction block encoded using a Reed-Solomon product code.

9. The communication device according to claim 1, wherein:
based on the information on the transmission characteristic indicating that the free-space optical communication is the communication performed between the satellite stations, the interleaving length is determined to be a first interleaving length;
based on the information on the transmission characteristic indicating that the free-space optical communication is the communication performed between the ground station and the satellite station, the interleaving length is determined to be a second interleaving length longer than the first interleaving length; and
based on the information on the transmission characteristic indicating that the free-space optical communication is the communication performed between the ground stations, the interleaving length is determined to be a third interleaving length longer than the first interleaving length and shorter than the second interleaving length.

10. The communication device according to claim 1, wherein the information on a transmission characteristic further comprises information on an error rate during the communication with the receiving side of the free-space optical communication.

11. The communication device according to claim 1, wherein
the transmit data includes, in addition to first data serving as payload data, second data used for exchanging control information between communication devices for the free-space optical communication, and
the interleaving circuitry is configured to determine the interleaving length based on the second data.

12. A communication device comprising:
detection circuitry configured to detect an interleaving length of received data that has been received through free-space optical communication and has been shaped such that the interleaving length is detectable therefrom; and
deinterleaving circuitry configured to deinterleave the received data based on the detected interleaving length,
wherein the interleaving length is based on information on a transmission characteristic of the free-space optical communication used for transmitting the transmit data, and
wherein the information on a transmission characteristic comprises information indicating that the free-space optical communication is:
communication performed between a ground station and a satellite station, or
communication performed between the satellite stations, or
communication performed between ground stations.

13. The communication device according to claim 12, wherein:
based on the information on the transmission characteristic indicating that the free-space optical communication is the communication performed between the satellite stations, the interleaving length is determined to be a first interleaving length;
based on the information on the transmission characteristic indicating that the free-space optical communication is the communication performed between the ground station and the satellite station, the interleaving length is determined to be a second interleaving length longer than the first interleaving length; and
based on the information on the transmission characteristic indicating that the free-space optical communication is the communication performed between the ground stations, the interleaving length is determined to be a third interleaving length (longer than the first interleaving length and shorter than the second interleaving length.

14. The communication device according to claim 12, wherein the information on a transmission characteristic further comprises information on an error rate during the communication with the receiving side of the free-space optical communication.

15. A communication method comprising:
determining an interleaving length of transmit data to be transmitted through free-space optical communication;
interleaving the transmit data at the determined interleaving length; and
shaping the interleaved transmit data so as to make the interleaving length detectable on a receiving side of the free-space optical communication,
wherein the interleaving circuitry is configured to determine the interleaving length based on information on a transmission characteristic of the free-space optical communication used for transmitting the transmit data, and
wherein the information on a transmission characteristic comprises information indicating that the free-space optical communication is:
communication performed between a around station and a satellite station, or
communication performed between the satellite stations, or
communication performed between around stations.

16. The method according to claim 15, wherein:
based on the information on the transmission characteristic indicating that the free-space optical communication is the communication performed between the satellite stations, the interleaving length is determined to be a first interleaving length;
based on the information on the transmission characteristic indicating that the free-space optical communication is the communication performed between the ground station and the satellite station, the interleaving length is determined to be a second interleaving length longer than the first interleaving length; and
based on the information on the transmission characteristic indicating that the free-space optical communication is the communication performed between the ground stations, the interleaving length is determined to be a third interleaving length (longer than the first interleaving length and shorter than the second interleaving length.

17. The method according to claim 15, wherein the information on a transmission characteristic further comprises information on an error rate during the communication with the receiving side of the free-space optical communication.

18. A non-transitory computer readable medium containing instructions for causing a computer to function as:
interleaving circuitry that determines an interleaving length of transmit data to be transmitted through free-space optical communication, and interleaves the transmit data at the determined interleaving length; and shaping circuitry that shapes the interleaved transmit data so as to make the interleaving length detectable on a receiving side of the free-space optical communication, wherein the interleaving circuitry is configured to determine the interleaving length based on information on a transmission characteristic of the free-space optical communication used for transmitting the transmit data, and wherein the information on a transmission characteristic comprises information indicating that the free-space optical communication is:
 communication performed between a ground station and a satellite station, or
 communication performed between the satellite stations, or
 communication performed between ground stations.

19. The non-transitory computer readable medium according to claim 18, wherein:
 based on the information on the transmission characteristic indicating that the free-space optical communication is the communication performed between the satellite stations, the interleaving length is determined to be a first interleaving length;
 based on the information on the transmission characteristic indicating that the free-space optical communication is the communication performed between the ground station and the satellite station, the interleaving length is determined to be a second interleaving length longer than the first interleaving length; and
 based on the information on the transmission characteristic indicating that the free-space optical communication is the communication performed between the ground stations, the interleaving length is determined to be a third interleaving length (longer than the first interleaving length and shorter than the second interleaving length.

20. The non-transitory computer readable medium according to claim 18, wherein the information on a transmission characteristic further comprises information on an error rate during the communication with the receiving side of the free-space optical communication.

* * * * *